US012660686B2

(12) United States Patent     (10) Patent No.:   US 12,660,686 B2

Sun et al.     (45) Date of Patent:    Jun. 16, 2026

(54) PACKAGED SEMICONDUCTOR DEVICES AND METHODS OF FORMING THE SAME

(71) Applicant: Taiwan Semiconductor Manufacturing Co., Ltd., Hsinchu (TW)

(72) Inventors: Sey-Ping Sun, Hsinchu (TW); Chih-Hang Tung, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 646 days.

(21) Appl. No.: 17/813,411

(22) Filed: Jul. 19, 2022

(65) Prior Publication Data

US 2023/0361068 A1     Nov. 9, 2023

Related U.S. Application Data

(60) Provisional application No. 63/364,040, filed on May 3, 2022.

(51) Int. Cl.
    *H01L 23/48*       (2006.01)
    *H01L 23/52*       (2006.01)
           (Continued)

(52) U.S. Cl.
    CPC .......... *H10W 90/00* (2026.01); *H10W 80/312* (2026.01); *H10W 80/327* (2026.01);
           (Continued)

(58) Field of Classification Search
CPC . H01L 2225/06513; H01L 2224/73204; H01L 25/0657; H01L 24/16; H01L 2924/15311; H01L 2224/0401; H01L 2225/06517; H01L 24/05; H01L 2224/08145; H01L 25/0655; H01L 23/5389; H01L 23/49827; H01L 2224/80896; H01L 2924/181; H01L 24/81;
           (Continued)

(56) References Cited

U.S. PATENT DOCUMENTS 8,217,500 B1 * 7/2012 Hool ....................... H01L 23/10
                                        257/E21.511
9,397,078 B1    7/2016 Chandolu et al.
              (Continued)

FOREIGN PATENT DOCUMENTS

JP        2021073695 A    5/2021
KR     20120010120 A    2/2012
              (Continued)

*Primary Examiner* — Niki H Nguyen

(74) *Attorney, Agent, or Firm* — Slater Matsil, LLP

(57) ABSTRACT

Methods of fusion bonding semiconductor dies in packaged semiconductor devices and packaged semiconductor devices formed by the same are disclosed. In an embodiment, a semiconductor package includes a first die including a semiconductor substrate and a through via extending through the semiconductor substrate; a second die bonded to the first die, the second die including a bond pad, the bond pad being physically and electrically coupled to the through via by metal-to-metal bonds; and an encapsulating material on the first die and laterally encapsulating the second die.

19 Claims, 19 Drawing Sheets

(51) Int. Cl.
    *H01L 29/40*      (2006.01)
    *H10W 90/00*     (2026.01)
    *H10W 80/00*     (2026.01)
    *H10W 90/20*     (2026.01)

(52) U.S. Cl.
    CPC ........ *H10W 90/288* (2026.01); *H10W 90/291*
        (2026.01); *H10W 90/297* (2026.01); *H10W*
                             *90/792* (2026.01)

(58) Field of Classification Search
    CPC ......... H01L 2924/18161; H01L 21/486; H01L
               2225/1058; H01L 2225/06548; H01L
               2224/16146; H01L 23/5226; H01L 24/29;
               H01L 2224/81815; H01L 2224/0557;
               H01L 24/14; H01L 2224/81; H01L
               2224/16238; H01L 2224/02379; H01L
               2224/1403; H01L 24/08; H01L 24/80;
               H01L 25/50; H01L 2225/06541; H01L
               2225/06582; H01L 2225/06589; H01L
               2924/1431; H01L 2924/1437
    See application file for complete search history.

(56)             References Cited

U.S. PATENT DOCUMENTS

| | | | | |
|---|---|---|---|---|
| 10,504,824 | B1 * | 12/2019 | Pan | H01L 23/147 |
| 11,239,205 | B2 * | 2/2022 | Hu | H01L 23/5389 |
| 11,637,089 | B2 * | 4/2023 | Choi | H01L 23/5385 |
| | | | | 257/773 |
| 2006/0267188 | A1 * | 11/2006 | Ishino | H01L 25/0657 |
| | | | | 257/723 |
| 2010/0144094 | A1 * | 6/2010 | Chen | H01L 21/76898 |
| | | | | 438/109 |
| 2010/0187670 | A1 * | 7/2010 | Lin | H01L 21/76898 |
| | | | | 257/E23.101 |
| 2012/0146242 | A1 * | 6/2012 | Fujishima | H01L 21/563 |
| | | | | 257/E23.06 |
| 2012/0182694 | A1 * | 7/2012 | Lin | H01L 23/16 |
| | | | | 361/728 |
| 2014/0134803 | A1 * | 5/2014 | Kelly | H01L 24/94 |
| | | | | 438/118 |
| 2015/0145140 | A1 * | 5/2015 | Haba | H01L 21/6835 |
| | | | | 257/774 |
| 2015/0255429 | A1 * | 9/2015 | Katkar | H01L 23/3675 |
| | | | | 257/774 |
| 2015/0348954 | A1 * | 12/2015 | Chandolu | H01L 25/0657 |
| | | | | 257/737 |
| 2016/0148918 | A1 | 5/2016 | Ye et al. | |
| 2017/0005072 | A1 * | 1/2017 | Wei | H01L 25/0652 |
| 2018/0005984 | A1 * | 1/2018 | Yu | H01L 25/0652 |
| 2018/0158749 | A1 * | 6/2018 | Yu | H01L 23/3677 |
| 2018/0247915 | A1 * | 8/2018 | Kinsley | H01L 23/367 |
| 2019/0189607 | A1 | 6/2019 | Uzoh et al. | |
| 2019/0326161 | A1 * | 10/2019 | Kelly | H01L 25/50 |
| 2020/0135698 | A1 * | 4/2020 | Hong | H01L 23/3135 |
| 2020/0312742 | A1 * | 10/2020 | Lofgreen | H01L 23/38 |
| 2020/0395338 | A1 * | 12/2020 | Hsu | H01L 25/0657 |
| 2020/0402960 | A1 * | 12/2020 | Chen | H01L 25/0657 |
| 2020/0411473 | A1 * | 12/2020 | Chen | H01L 21/6835 |
| 2021/0057332 | A1 * | 2/2021 | Chen | H01L 21/76898 |
| 2021/0098380 | A1 * | 4/2021 | Chen | H01L 25/117 |
| 2021/0193582 | A1 * | 6/2021 | Yu | H01L 21/6835 |
| 2021/0305162 | A1 * | 9/2021 | Ganesan | H01L 23/5384 |
| 2021/0327866 | A1 * | 10/2021 | Yu | H01L 25/50 |
| 2021/0407920 | A1 * | 12/2021 | Chen | H01L 23/3142 |
| 2022/0052010 | A1 | 2/2022 | Goda et al. | |
| 2022/0293524 | A1 * | 9/2022 | Tsai | H01L 24/19 |
| 2022/0328447 | A1 * | 10/2022 | Kao | H01L 23/481 |

FOREIGN PATENT DOCUMENTS

| | | |
|---|---|---|
| KR | 20170122245 A | 11/2017 |
| KR | 20190103483 A | 9/2019 |
| KR | 20200006196 A | 1/2020 |
| TW | 202125746 A | 7/2021 |
| TW | 202215608 A | 4/2022 |

* cited by examiner

PACKAGED SEMICONDUCTOR DEVICES AND METHODS OF FORMING THE SAME

CROSS-REFERENCE TO RELATED APPLICATIONS

This application claims the benefit of U.S. Provisional Application No. 63/364,040, filed on May 3, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, and the like). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
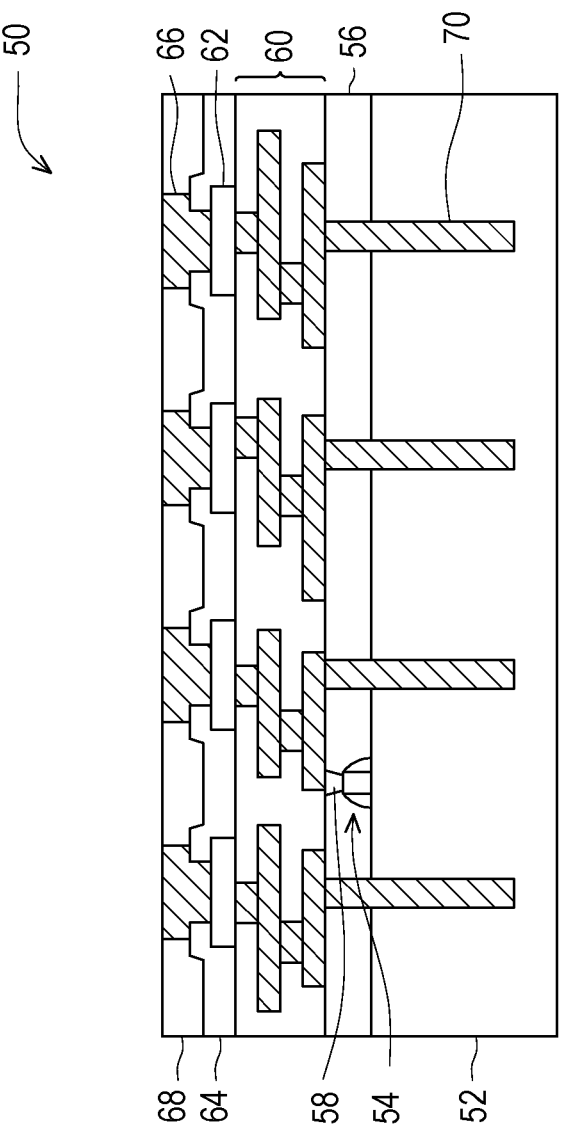
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods of bonding semiconductor components in a semiconductor package, and semiconductor packages formed by the same. The methods include bonding the semiconductor components to one another using dielectric-to-dielectric bonding (e.g., fusion bonding), or dielectric-to-dielectric bonding and metal-to-metal bonding (e.g., hybrid bonding). Thin dielectric layers may be used in the dielectric-to-dielectric bonding, which reduces thermal resistance from the dielectric layers, thereby improving heat dissipation. In some embodiments, the methods include bonding the semiconductor components with fusion bonding only, which allows for bond pads to be omitted and dielectric layers to be formed with reduced thicknesses. This reduces costs, reduces thermal resistance, and improves heat dissipation.

Various embodiments are described below in a particular context. Specifically, a chip on chip on wafer on substrate-type system on integrated chip (SoIC) package is described. However, various embodiments may also be applied to other types of packaging technologies, such as, chip-on-wafer-on-substrate (CoWoS) packages, die-die-substrate stacked packages, integrated fan-out (InFO) packages, and/or other types of semiconductor packages.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., a central processing unit (CPU), a graphics processing unit (GPU), a system-on-a-chip (SoC), an application processor (AP), a microcontroller, or the like); a memory die (e.g., a dynamic random access memory (DRAM) die, a static random access memory (SRAM) die, or the like); a power management die (e.g., a power management integrated circuit (PMIC) die); a radio frequency (RF) die; a sensor die; a micro-electro-mechanical-system (MEMS) die; a signal processing die (e.g., a digital signal processing (DSP) die); a front-end die (e.g., an analog front-end (AFE) die); or a combination thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. In some embodiments, the integrated circuit die 50 includes a semiconductor substrate 52, such as silicon, doped or un-doped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may be used. The semiconductor substrate 52 has an active surface (e.g., the surface facing upwards in FIG. 1), which may be referred to as a front-side, and an inactive surface (e.g., the surface facing downwards in FIG. 1), which may be referred to as a backside.

Devices (represented by a transistor) 54 may be formed at the front-side of the semiconductor substrate 52. The devices 54 may be active devices (e.g., transistors, diodes, or the like), capacitors, resistors, or the like. An inter-layer dielectric (ILD) 56 is on the front-side of the semiconductor substrate 52. The ILD 56 surrounds and may cover the devices 54. The ILD 56 may include one or more dielectric layers formed of materials such as phosphosilicate glass (PSG), boro-silicate glass (BSG), boron-doped phosphosilicate glass (BPSG), un-doped silicate glass (USG), or the like.

Conductive plugs 58 may be formed extending through the ILD 56. The conductive plugs 58 may be electrically and physically coupled to the devices 54. In embodiments in which the devices 54 are transistors, the conductive plugs 58 may be coupled to gates and/or source/drain regions (source/drain regions may refer to a source or a drain, individually or collectively, dependent upon the context) of the transistors. The conductive plugs 58 may be formed of tungsten, cobalt, nickel, copper, silver, gold, aluminum, the like, or combinations thereof.

Conductive vias 70 may be formed extending through the ILD 56 and into the semiconductor substrate 52. The conductive vias 70 may be subsequently exposed through the backside of the semiconductor substrate 52, and may be used to provide electrical connections through the semiconductor substrate 52 (e.g., between the front-side of the semiconductor substrate 52 and the backside of the semiconductor substrate 52). In some embodiments, the conductive vias 70 may be formed by forming recesses in the ILD 56 and/or the semiconductor substrate 52. The recesses may be formed by etching, milling, laser techniques, a combination thereof, or the like. A liner layer may be formed in the recesses, such as by thermal oxidation, atomic layer deposition (ALD), chemical vapor deposition (CVD), or the like. The liner layer may include oxides, such as silicon oxide, silicon oxynitride, or the like. A barrier layer and/or an adhesion layer may be conformally deposited in the recesses, such as by CVD, ALD, physical vapor deposition (PVD), a combination thereof, or the like. The barrier layer and/or the adhesion layer may be formed of titanium, titanium nitride, tantalum, tantalum nitride, or the like. A conductive fill material is deposited on the barrier layer and/or the adhesion layer and fills the recesses. The conductive fill material may be deposited by an electro-chemical plating process, CVD, ALD, PVD, a combination thereof, or the like. Examples of conductive fill material include copper, a copper alloy, silver, gold, tungsten, ruthenium, cobalt, aluminum, nickel, a combination thereof, or the like. Excess portions of the conductive fill material, the adhesion layer, the barrier layer, and/or the liner layer, such as portions extending along top surfaces of the ILD 56 and/or the semiconductor substrate 52 are removed from the surfaces of the ILD 56 and/or the semiconductor substrate 52 by a planarization process, such as a chemical-mechanical polish (CMP), a grinding process, an etch-back process, or the like. Remaining portions of the liner layer, the barrier layer, the adhesion layer, and/or the conductive fill material form the conductive vias 70.

An interconnect structure 60 is formed on the ILD 56, the conductive plugs 58, and the conductive vias 70. The interconnect structure 60 interconnects the devices 54 to form integrated circuits. In some embodiments, the interconnect structure 60 may be formed by metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58, and are electrically coupled to the conductive vias 70.

The integrated circuit die 50 further includes pads 62, such as aluminum pads, to which external connections are made. The pads 62 are on the front-side of the semiconductor substrate 52, such as in and/or on the interconnect structure 60. Solder regions (e.g., solder balls or solder bumps) may be disposed on the pads 62. The solder regions may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged. Dies that fail the CP testing, are not packaged. After testing, the solder regions may be removed in subsequent processing steps.

One or more passivation films 64 are on the integrated circuit die 50, such as on portions of the interconnect structure 60 and the pads 62. Openings are formed extending through the passivation films 64 to the pads 62. Die connectors 66, such as conductive pillars (e.g., formed of a metal such as copper), are formed in the openings extending through the passivation films 64. The die connectors 66 may be physically and electrically coupled to respective ones of the pads 62. The die connectors 66 may be formed by plating, or the like. In some embodiments, the die connectors 66 may be formed from materials and by processes the same as or similar to the conductive vias 70. The die connectors 66 are electrically coupled to the integrated circuits of the integrated circuit die 50.

A dielectric layer 68 may (or may not) be on the front-side of the semiconductor substrate 52, such as on the passivation films 64 and around the die connectors 66. The dielectric layer 68 laterally encapsulates the die connectors 66, and the dielectric layer 68 is laterally coterminous with the semiconductor substrate 52. The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed by spin coating, lamination, CVD, or the like. Initially, the dielectric layer 68 may bury the die connectors 66, such that a topmost surface of the dielectric layer 68 is above topmost surfaces of the die connectors 66. In some embodiments, solder regions may be formed on the die connectors 66, and the dielectric layer 68 may bury the solder regions. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

Figure 2:
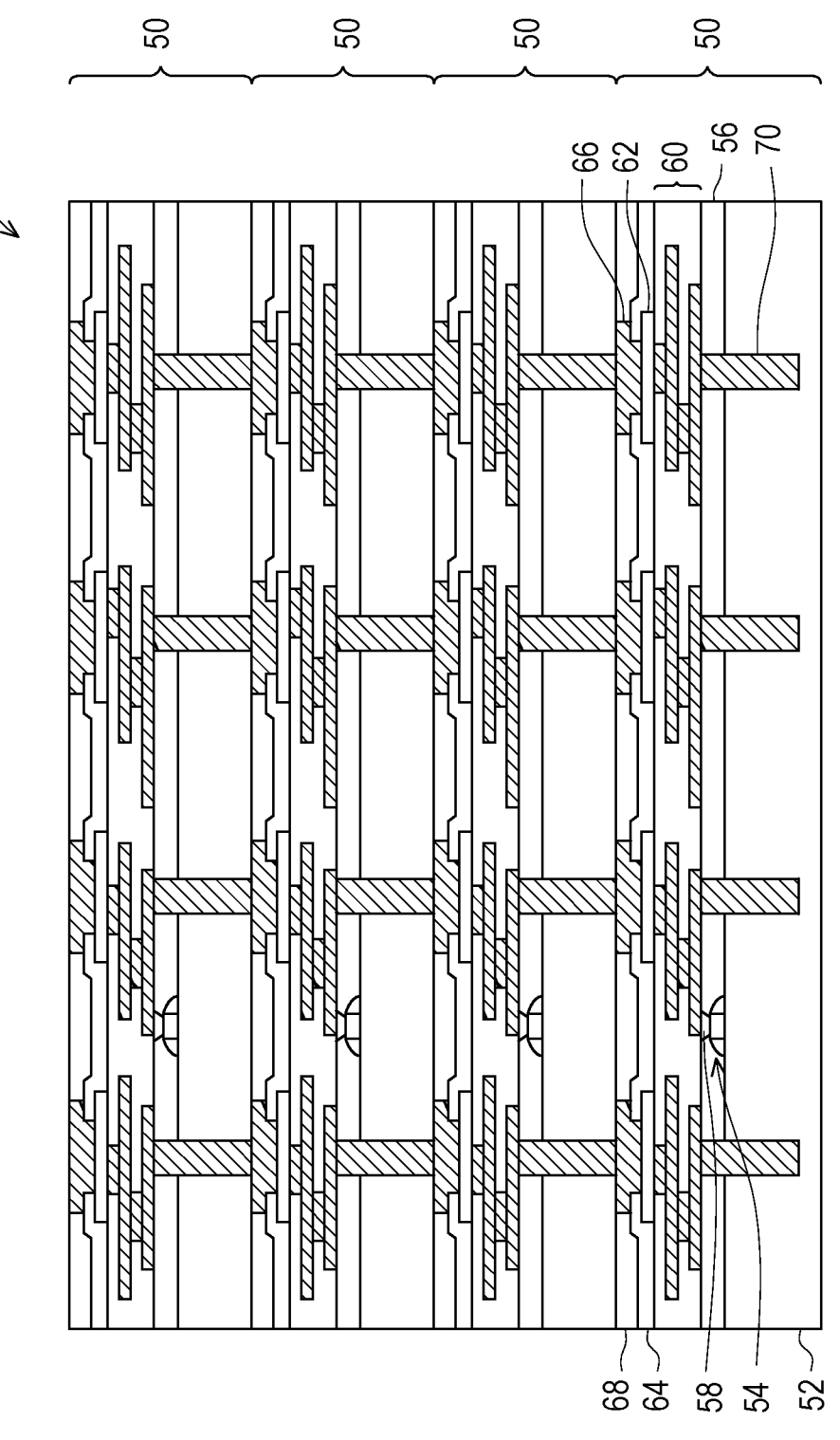
FIG. 2 illustrates a cross-sectional view of a die stack, in accordance with some embodiments.

FIG. 2 illustrates a cross-sectional view of a die stack 80, in accordance with some embodiments. The die stack 80 may have a single function (e.g., a logic die, a memory die, or the like), or may have multiple functions. In some embodiments, the die stack 80 is a memory device such as an SRAM stack. As illustrated in FIG. 2, the die stack 80 is a stacked device that includes multiple integrated circuit dies 50. For example, the die stack 80 may be a memory device that includes multiple memory dies, such as an SRAM stack including multiple SRAM dies, or the like. Each of the integrated circuit dies 50 in the die stack 80 may (or may not) have any or all of the structures illustrated in FIG. 1.

In some embodiments, the integrated circuit dies 50 of the die stack 80 are attached to one another in a face-to-back arrangement, with conductive vias 70 of an overlying integrated circuit die 50 being physically and electrically coupled with die connectors 66 of an underlying integrated circuit die 50. Although FIG. 2 illustrates the die stack 80 as including four integrated circuit dies 50, the die stack 80 may include any number of the integrated circuit dies 50, such as more or less than four of the integrated circuit dies 50. The integrated circuit dies 50 of the die stack 80 may be bonded to one another by dielectric-to-dielectric bonds and metal-to-metal bonds (e.g., hybrid bonding). As an example, a first integrated circuit die 50 is disposed face up, and a second integrated circuit die 50 is placed over the first integrated circuit die 50 and also disposed face up such that a backside of the second integrated circuit die 50 faces a front-side of the first integrated circuit die. This may be referred to as a face-to-back configuration (F2B).

Figure 8:
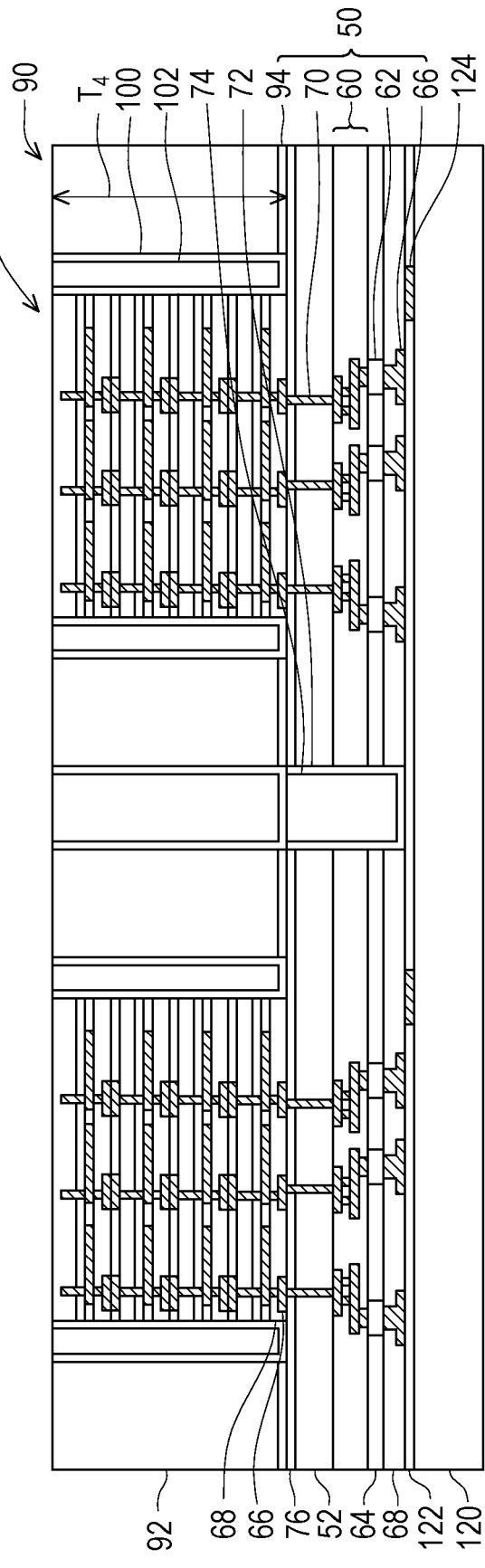
Figure 9:
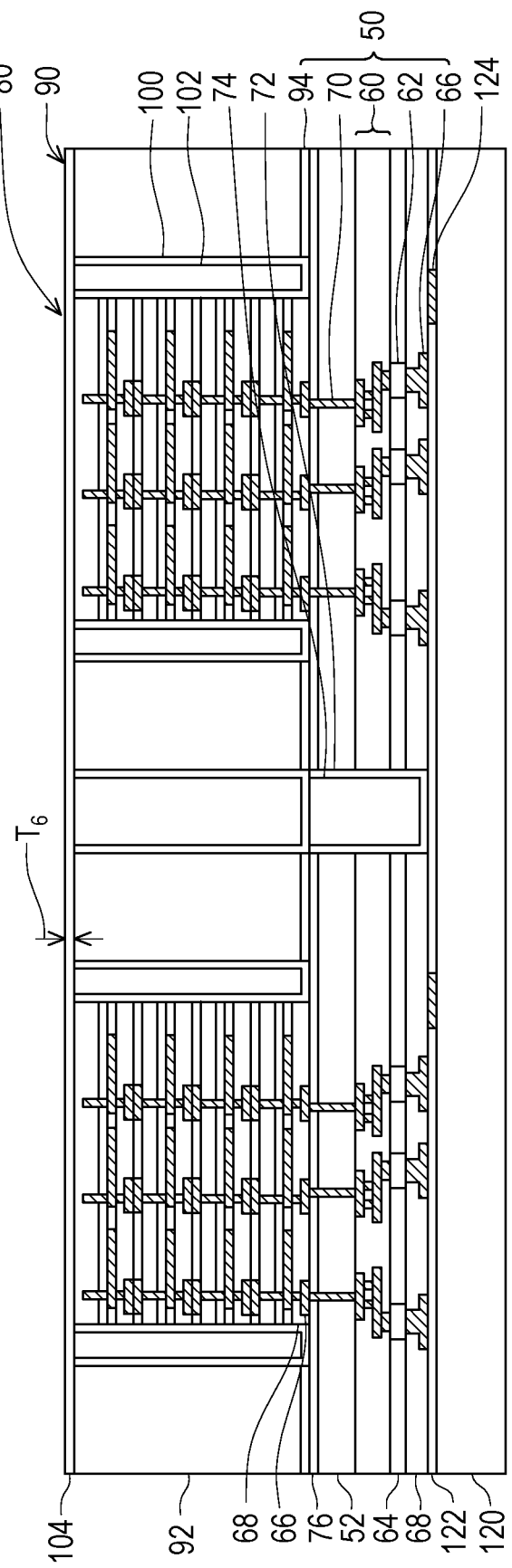
Figure 10:
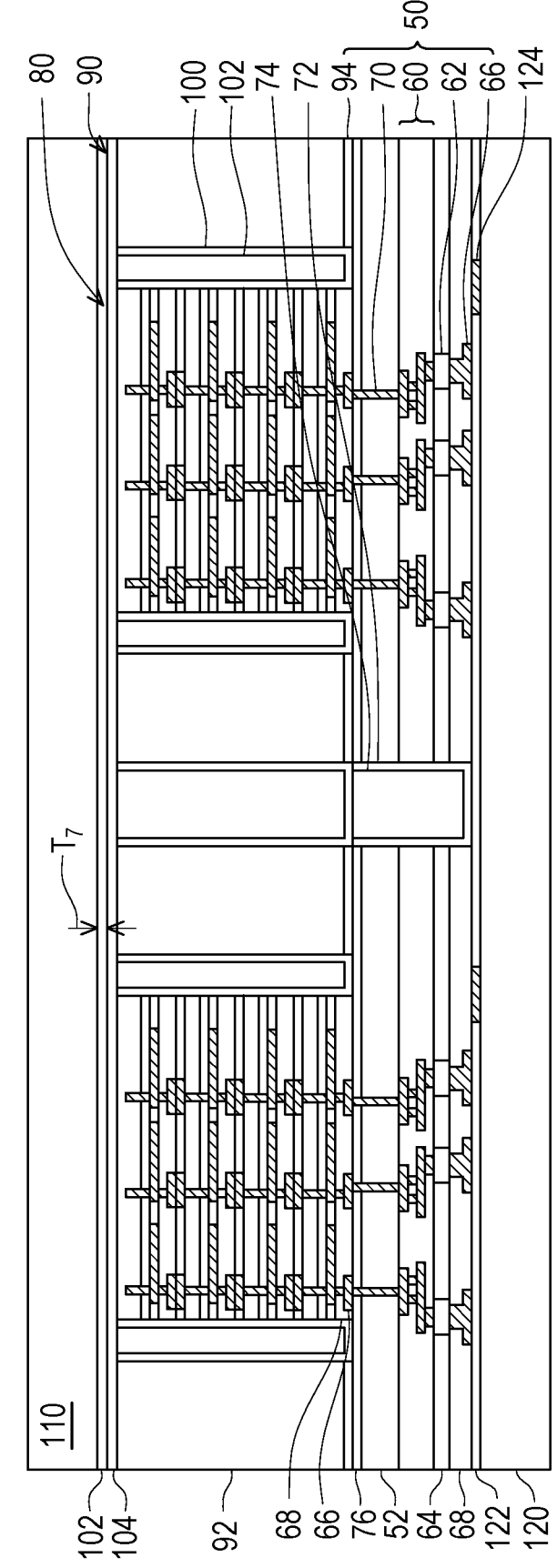

FIGS. 3 through 10 illustrate an embodiment in which heat transfer dies 90 (illustrated in FIGS. 7A and 7B) are bonded to integrated circuit dies 50 by dielectric-to-dielectric bonds (e.g., fusion bonding), die stacks 80 (illustrated in FIGS. 7A and 7B) are bonded to the integrated circuit dies 50 by dielectric-to-dielectric bonds and metal-to-metal bonds (e.g., hybrid bonding), and a support substrate 110 (illustrated in FIG. 10) is bonded to the heat transfer dies 90 and the die stacks 80 by dielectric-to-dielectric bonds (e.g., fusion bonding), thus forming a packaged semiconductor device 200 (illustrated in FIG. 10).

Figure 3:
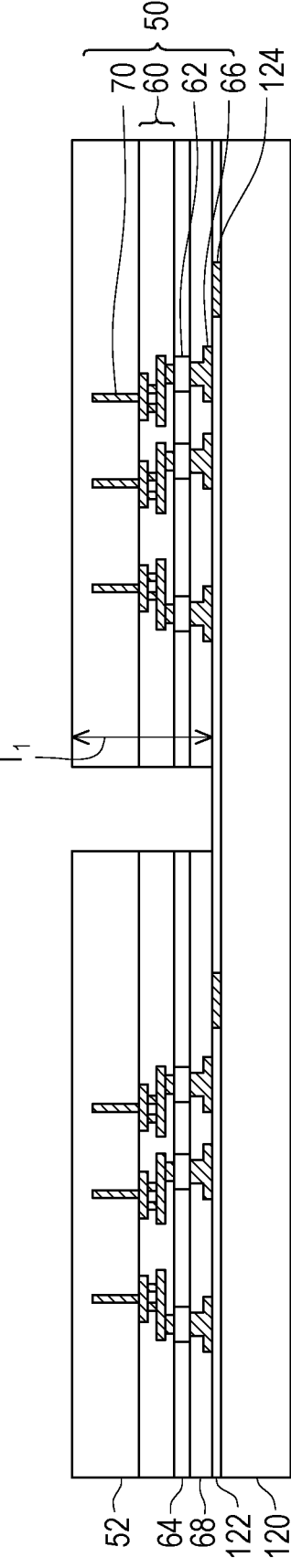
FIGS. 3, 4, 5, 6, 7A, 7B, 8, 9, 10, 11, 12A, 12B, 13, 14A, 14B, 15, and 16 illustrate cross-sectional views of intermediate steps during processes for forming packaged semiconductor devices, in accordance with some embodiments.

In FIG. 3, two integrated circuit dies 50 are attached to a carrier substrate 120. The integrated circuit dies 50 may be bonded to the carrier substrate 120 by bonding the dielectric layers 68 of the integrated circuit dies 50 to a bonding layer 122 on the carrier substrate 120. The carrier substrate 120 may be a glass carrier substrate, a ceramic carrier substrate, a wafer (e.g., a silicon wafer), or the like. The carrier substrate 120 may provide structural support during subsequent processing steps and in the completed device.

In some embodiments, the integrated circuit dies 50 may be bonded to the carrier substrate 120 using a suitable technique, such as dielectric-to-dielectric bonding (referred to as fusion bonding), or the like. The bonding layer 122 may be an oxide layer, such as silicon oxide (e.g., a high density plasma (HDP) oxide or the like), that is formed on a surface of the carrier substrate 120 prior to bonding using, for example, CVD, ALD, PVD, thermal oxidation, or the like. Other suitable materials may be used for the bonding layer 122.

The dielectric-to-dielectric bonding process may further include applying a surface treatment the dielectric layers 68 and/or the bonding layer 122. The surface treatment may include a plasma treatment. The plasma treatment may be performed in a vacuum environment. After the plasma treatment, the surface treatment may further include a cleaning process (e.g., a rinse with deionized water or the like) that may be applied to the dielectric layers 68 and/or the bonding layer 122. The integrated circuit dies 50 are then aligned with the carrier substrate 120 (such as being aligned relative to alignment marks 124 disposed in the bonding layer 122). The integrated circuit dies 50 and the carrier substrate 120 are pressed against each other to initiate a pre-bonding of the dielectric layers 68 and the bonding layer 122. The pre-bonding may be performed at room temperature (e.g., between about 21° C. and about 25° C.). After the pre-bonding, an annealing process may be applied by, for example, heating the integrated circuit dies 50 and/or the carrier substrate 120 to a temperature of about 170° C. to about 500° C.

In some embodiments, alignment marks 124 may be formed in the bonding layer 122 on the carrier substrate 120, and may be used to align the integrated circuit dies 50 with respect to the carrier substrate 120. The alignment marks 124 may be formed of metals, metal alloys, metal compounds or the like. The alignment marks 124 may be formed of materials having high contrast to the materials surrounding the alignment marks 124, such as the materials of the bonding layer 122. In some embodiments, the alignment marks 124 may be formed of or may include copper, a copper alloy, tungsten, nickel, or the like. Each of alignment marks 124 may include a metal material, and may or may not include an adhesion layer underlying and lining the metal material. The adhesion layer may be formed of or comprise titanium, titanium nitride, tantalum, tantalum nitride, or the like. The formation process may include depositing the adhesion layer (if included) as a conformal layer using PVD, and depositing a metallic material on the adhesion layer. The metallic material may be deposited by a plating process, such as an electro-chemical plating (ECP) process. A planarization process, such as a CMP may be performed to remove excess portions of the adhesion layer and the metallic material, leaving the alignment marks 124.

In some embodiments, individual integrated circuit dies 50 may have different thicknesses. As such, after the integrated circuit dies 50 are attached to the carrier substrate 120, a planarization process may be performed to level backside surfaces of the integrated circuit dies 50 with one another. The planarization process may be a CMP, a grinding process, an etch-back process, or the like. Following the planarization process, the integrated circuit dies 50 may have thicknesses $T_1$ in a range from about 25 μm to about 40 μm.

Figure 4:
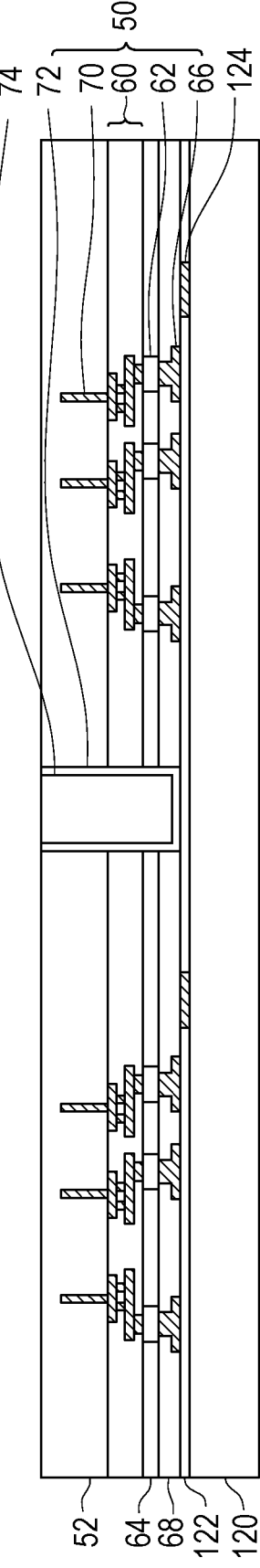

In FIG. 4, a dielectric liner 72 and a dielectric layer 74 are formed on the integrated circuit dies 50 and the carrier substrate 120. The dielectric liner 72 and the dielectric layer 74 may be collectively referred to as gap-filling layers. The dielectric liner 72 may be formed of a dielectric material having good adhesion to the bonding layer 122 and the integrated circuit dies 50. In some embodiments, the dielectric liner 72 is formed of a nitride-containing material, such as silicon nitride. The dielectric liner 72 may be deposited as a conformal layer. The dielectric liner 72 may be deposited by a conformal deposition process, such as ALD, CVD, or the like.

The dielectric layer 74 may be formed of a material different from the material of the dielectric liner 72. In some embodiments, the dielectric layer 74 may be formed of silicon oxide, silicon carbide, silicon oxynitride, silicon oxy-carbo-nitride, PSG, BSG, BPSG, or the like. The dielectric layer 74 may be formed using CVD, high-density plasma CVD (HDPCVD), flowable CVD, spin-on coating, or the like. The dielectric layer 74 may fill gaps between adjacent integrated circuit dies 50. After the dielectric liner 72 and the dielectric layer 74 are deposited, a planarization process, such as a CMP, a grinding process, an etch-back process, or the like is performed to remove excess portions of the dielectric liner 72 and the dielectric layer 74, exposing the integrated circuit dies 50.

Figure 5:
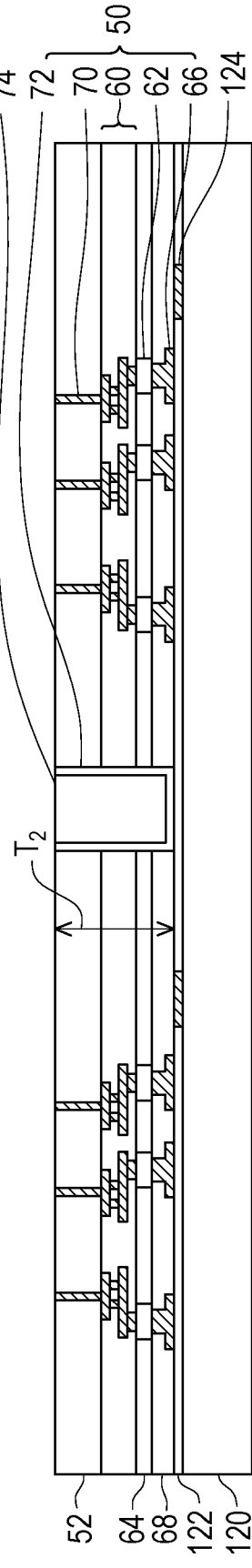

In FIG. 5, a thinning process is applied to backsides of the integrated circuit dies 50, the dielectric liner 72, and the dielectric layer 74. The thinning process may include a planarization process (e.g., a mechanical grinding, a CMP, or the like), an etch-back process, combinations thereof, or the like. The thinning process may expose the conductive vias 70. Following the thinning process, the integrated circuit dies 50 may have a thickness $T_2$ in a range from about 20 µm to about 35 µm.

Figure 6:
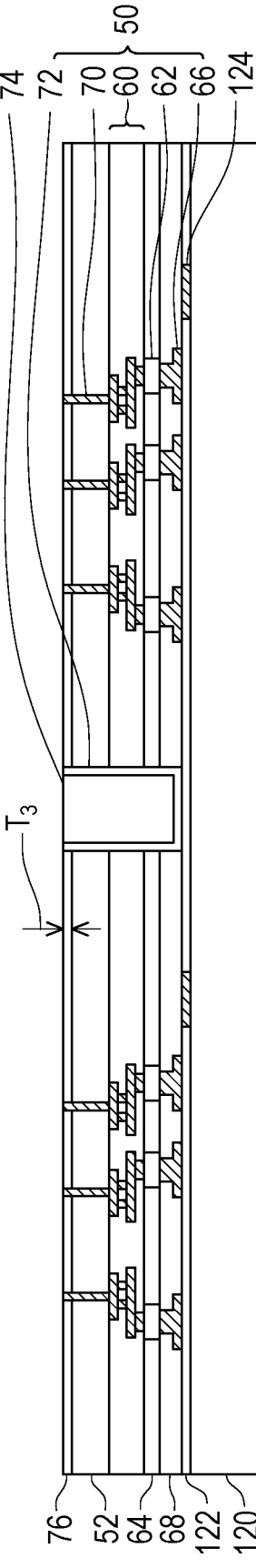

In FIG. 6, the semiconductor substrates 52 of the integrated circuit dies 50 are recessed so that the conductive vias 70 protrude above back surfaces of the semiconductor substrates 52 and insulating layers 76 are formed on the semiconductor substrates 52. The semiconductor substrates 52 may be recessed by suitable etching processes, which may include isotropic etching processes such as wet etching, anisotropic etching process such as dry etching, or the like. After recessing the semiconductor substrates 52, the insulating layers 76 may be formed by depositing an insulating material on the upper surfaces (e.g., backsides) of the integrated circuit dies 50 and planarizing the insulating material to level surfaces of the insulating material with surfaces of the conductive vias 70, the dielectric liner 72 and the dielectric layer 74. The insulating material may be formed of silicon oxide, silicon carbide, silicon oxynitride, silicon oxy-carbo-nitride, PSG, BSG, BPSG, or the like. The insulating material may be deposited by CVD, ALD, spin-on coating, or the like. After planarizing the insulating material, surfaces of the insulating layers 76 may be level with surfaces of the conductive vias 70, the dielectric liner 72 and the dielectric layer 74, within process variations.

In some embodiments, the semiconductor substrates 52 may be recessed a distance in a range from about 100 Å to about 500 Å such that the insulating layers 76 have thicknesses $T_3$ in the range from about 100 Å to about 500 Å. The insulating layers 76 may provide isolation between the conductive vias 70, and may be used in subsequent dielectric-to-dielectric bonding processes used to bond various dies to the integrated circuit dies 50. Providing the insulating layers 76 with the prescribed thicknesses minimizes the thicknesses of the insulating layers 76, while providing sufficient material to act as isolation between the conductive vias 70 and for the subsequent dielectric-to-dielectric bonding processes. Minimizing the thicknesses of the insulating layers 76 reduces the thermal resistance of the insulating layers 76, which improves heat dissipation in packaged semiconductor devices.

Figure 7A:
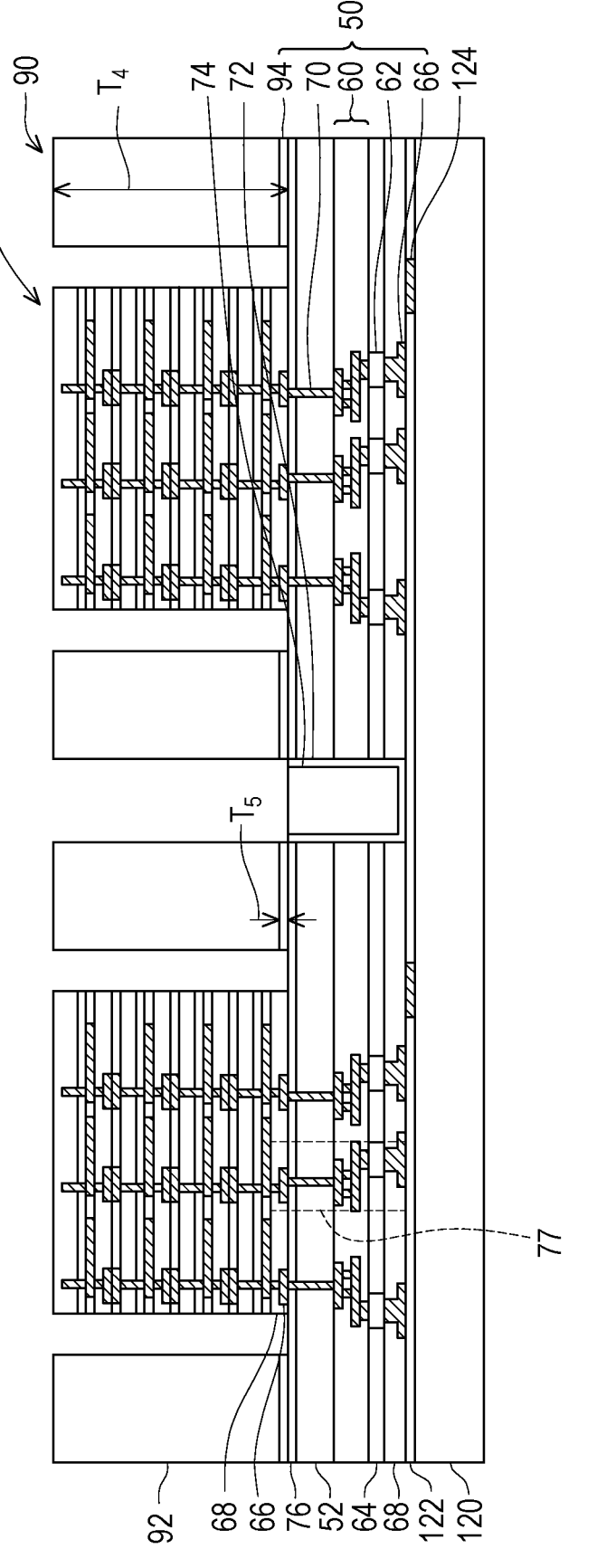
Figure 7B:
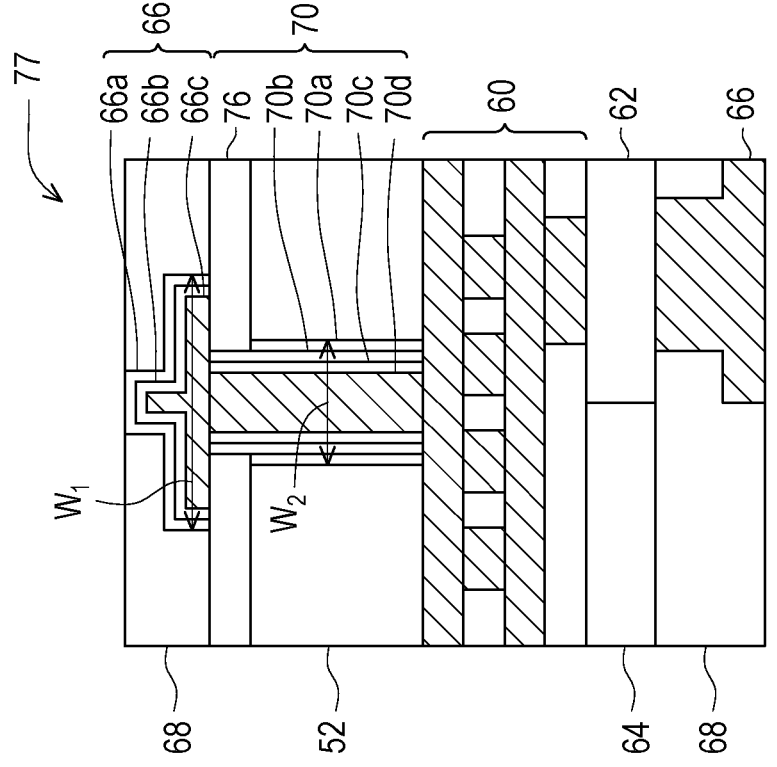

In FIGS. 7A and 7B, die stacks 80 and heat transfer dies 90 are bonded to the insulating layers 76 on the integrated circuit dies 50. FIG. 7B illustrates a detailed view of a region 77 of FIG. 7A. In the embodiment illustrated in FIGS. 7A and 7B, the die stacks 80 are bonded to the integrated circuit dies 50 by hybrid bonding and the heat transfer dies 90 are bonded to the integrated circuit dies 50 by fusion bonding. However, in some embodiments (such as the embodiment discussed below with respect to FIGS. 11 through 14B), both the die stacks 80 and the heat transfer dies 90 may be bonded to the integrated circuit dies 50 by hybrid bonding. The die stacks 80 and the heat transfer dies 90 may have thicknesses $T_4$ in a range from about 80 µm to about 600 µm. The thicknesses $T_4$ of the die stacks 80 and the heat transfer dies 90 may affect materials that are subsequently formed around the die stacks 80 and the heat transfer dies 90, as will be discussed in detail.

The heat transfer dies 90 include substrates 92 and dielectric layers 94 on the substrates 92. The substrates 92 may be formed of homogenous materials, and may be free from devices, metal lines, and the like. The substrates 92 may be formed of materials having high thermal conductivities such as silicon, ceramic, heat conductive glass, metals such as copper or iron, or the like. The dielectric layers 94 may be formed on the substrates 92 and may be used to attach the heat transfer dies 90 to the integrated circuit dies 50. In some embodiments, the dielectric layers 94 may be formed of materials such as silicon oxide, silicon nitride, silicon carbide, silicon carbon nitride, silicon oxygen nitride, silicon oxygen carbon nitride, combinations thereof, or the like. The dielectric layers 94 may have thicknesses $T_5$ in a range from about 30 Å to about 300 Å. Providing the dielectric layers 94 with the prescribed thicknesses minimizes the thicknesses of the dielectric layers 94, while providing sufficient material for bonding processes used to attach the heat transfer dies 90 to the integrated circuit dies 50. Minimizing the thicknesses of the dielectric layers 94 reduces the thermal resistance of the dielectric layers 94, which improves heat dissipation in packaged semiconductor devices, such as from the integrated circuit dies 50 to the heat transfer dies 90. The heat transfer dies 90 may be referred to as dummy dies, thermal enhancement dies, or heat dissipation dies.

The heat transfer dies 90 are bonded to the integrated circuit dies 50 through the dielectric layers 94 and the insulating layers 76. The die stacks 80 are bonded to the integrated circuit dies 50 through the dielectric layers 68, the die connectors 66, the conductive vias 70, and the insulating layers 76. A desired type and quantity of the heat transfer dies 90 and the die stacks 80 are adhered on each of the integrated circuit dies 50. In the illustrated embodiment, multiple heat transfer dies 90 are adhered adjacent to each of the die stacks 80. The integrated circuit dies 50 may be logic devices, such as central processing units (CPUs), graphics processing units (GPUs), systems-on-chips (SoCs), microcontrollers, or the like. The die stacks 80 may be memory devices, such as dynamic random access memory (DRAM) dies, static random access memory (SRAM) dies, hybrid memory cube (HMC) modules, high-bandwidth memory (HBM) modules, or the like. The integrated circuit dies 50 and the die stacks 80 may be formed in processes of a same technology node, or may be formed in processes of different technology nodes. For example, the integrated circuit dies 50 may be of a more advanced process node than the die stacks 80. Other combinations of integrated circuit dies (e.g., with or without stacked dies) are also possible in some embodiments.

In the embodiment illustrated in FIGS. 7A and 7B, the die stacks 80 are bonded to the integrated circuit dies 50 in a hybrid bonding configuration, and the heat transfer dies 90 are bonded to the integrated circuit dies 50 in a fusion bonding configuration. The die stacks 80 are disposed face down such that front sides of the die stacks 80 face the insulation layers 76 on backsides of the integrated circuit dies 50 and backsides of the die stacks 80 face away from the integrated circuit dies 50. This may be referred to as a face-to-back arrangement.

The dielectric layers 68 of the die stacks 80 may be directly bonded to the insulating layers 76 of the integrated circuit dies 50; the dielectric layers 94 of the heat transfer dies 90 may be directly bonded to the insulating layers 76 of the integrated circuit dies 50; and the die connectors 66 of the die stacks 80 may be directly bonded to the conductive vias 70 of the integrated circuit dies 50. In some embodiments, the bonds between the insulating layers 76 and each of the dielectric layers 68 and the dielectric layers 94 are dielectric-to-dielectric bonds, such as oxide-to-oxide bonds or the like. The heat transfer dies 90 and portions of the insulating layers 76 adjacent the dielectric layers 94 may be free from metal features, such that dielectric-to-dielectric bonds are formed at interfaces having widths extending the widths of the heat transfer dies 90. The hybrid bonding process directly bonds the die connectors 66 of the die stacks 80 to the conductive vias 70 of the integrated circuit dies 50 through direct metal-to-metal bonding. Thus, the heat transfer dies 90 are mechanically coupled to the integrated circuit dies 50 and the die stacks 80 are electrically and mechanically coupled to the integrated circuit dies 50. In some embodiments, interfaces between the die stacks 80 and the integrated circuit dies 50 also include dielectric-to-metal interfaces (e.g., where the die connectors 66 and the conductive vias 70 are not perfectly aligned and/or have different widths).

As an example, the fusion bonding process and the hybrid bonding process start with applying a surface treatment to one or more of the dielectric layers 68, the dielectric layers 94 and/or the insulating layers 76. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the dielectric layers 68, the dielectric layers 94 and/or the insulating layers 76. The die connectors 66 are aligned to the conductive vias 70, and the heat transfer dies 90 are aligned to the integrated circuit dies 50 (e.g., such that outer side surfaces of the heat transfer dies 90 are aligned with and coterminous with outer side surfaces of the integrated circuit dies 50). When the die stacks 80 and the integrated circuit dies 50 are aligned, the die connectors 66 may overlap with corresponding conductive vias 70.

A pre-bonding step is performed during which each heat transfer die 90 is placed in contact with the insulating layers 76 and each die stack 80 is placed in contact with the insulating layers 76 and the conductive vias 70. The pre-bonding step may be performed at room temperature (e.g., from about 21° C. to about 25° C.). An anneal may be performed at a temperature in a range from about 150° C. to about 400° C., for a duration in a range from about 0.5 hours to about 3 hours. This causes metal in the die connectors 66 (e.g., copper) and metal in the conductive vias 70 (e.g., copper) to inter-diffuse to each other, forming the direct metal-to-metal bonding. Other direct bonding processes (e.g., using adhesives, polymer-to-polymer bonding, or the like) may be used in some embodiments.

The heat transfer dies 90 and the die stacks 80 are bonded to the integrated circuit dies 50 without the use of solder connections (e.g., micro-bumps or the like). By directly bonding the heat transfer dies 90 and the die stacks 80 to the integrated circuit dies 50, advantages can be achieved, such as, finer bump pitch; small form factor packages by using hybrid bonds and fusion bonds; smaller bond pitch scalability for chip I/O to realize high density die-to-die interconnects; improved mechanical endurance; improved electrical performance; reduced defects; and increased yield. Further, shorter die-to-die may be achieved between the die stacks 80 and the integrated circuit dies 50, which has benefits including smaller form-factor, higher bandwidth, improved power integrity (PI), improved signal integrity (SI), and lower power consumption.

As illustrated in FIGS. 7A and 7B and discussed above, the die connectors 66 of the die stacks 80 are directly bonded to the conductive vias 70, without additional bond pads being formed between the die connectors 66 and the conductive vias 70. This allows for overall thicknesses of packaged semiconductor devices to be reduced. The insulating layers 76 can be formed with reduced thicknesses as compared with structures including bond pads between the die connectors 66 and the conductive vias 70. This reduces the thermal resistance of the integrated circuit dies 50, which improves heat dissipation in packaged semiconductor devices.

FIG. 7B illustrates additional details of the die connectors 66 and the conductive vias 70. As illustrated in FIG. 7B, the die connectors 66 may include barrier layers 66a, adhesion layers 66b, and/or conductive fill materials 66c. The conductive vias 70 may include liner layers 70a, barrier layers 70b, adhesion layers 70c, and/or conductive fill materials 70d. In some embodiments, the liner layers 70a may include oxides, such as silicon oxide, silicon oxynitride, or the like. The barrier layers 66a and 70b may include titanium, titanium nitride, tantalum, tantalum nitride, or the like. The adhesion layers 66b and 70c may include titanium, titanium nitride, tantalum, tantalum nitride, or the like. The conductive fill materials 66c and 70d may include copper, a copper alloy, silver, gold, tungsten, ruthenium, cobalt, aluminum, nickel, or the like. The die connectors 66 may have widths $W_1$ in a range from about 2.5 μm to about 5 μm, the conductive vias 70 may have widths $W_2$ in a range from about 1.5 μm to about 4 μm, and a ratio of the widths $W_2$ of the conductive vias 70 to the widths $W_1$ of the die connectors 66 may be in a range from about 0.6 to about 0.8. Providing the die connectors 66 and the conductive vias 70 with the prescribed widths ensures good bonding between the die stacks 80 and the integrated circuit dies 50.

In FIG. 8, liner layers 100 and gap-fill materials 102 are formed on the heat transfer dies 90, the die stacks 80, and the integrated circuit dies 50. The liner layers 100 and the gap-fill materials 102 may be collectively referred to as gap-filling layers. The liner layers 100 may be formed of a dielectric material having good adhesion to the insulating layers 76, dielectric liner 72, dielectric layer 74, heat transfer dies 90, and the die stacks 80. In some embodiments, the liner layers 100 is formed of a nitride-containing material, such as silicon nitride. The liner layers 100 may be deposited as a conformal layer. The liner layers 100 may be deposited by a conformal deposition process, such as ALD, CVD, or the like. In some embodiments, the gap-fill materials 102 may be formed of a conductive material, and the liner layers 100 may be a barrier layer. In such embodiments, the liner layers 100 may be conformally deposited by CVD, ALD, PVD, thermal oxidation, a combination thereof, or the like. The liner layers 100 may be formed of an oxide, a nitride, a carbide, combinations thereof, or the like.

The gap-fill materials 102 may be formed of a material different from the material of the liner layers 100. In some embodiments, the gap-fill materials 102 may be formed of silicon oxide, silicon carbide, silicon oxynitride, silicon oxy-carbo-nitride, PSG, BSG, BPSG, or the like.

The gap-fill materials 102 may be formed using CVD, HDPCVD, flowable CVD, spin-on coating, or the like. In some embodiments, the gap-fill materials 102 may be formed of a conductive material, such as a metal that may include copper or the like. Forming the gap-fill materials 102 of a conductive material may increase heat dissipation away from the integrated circuit dies 50 and the die stacks 80, improving device performance and reducing device defects in completed packaged semiconductor devices. The gap-fill materials 102 may be formed using electro-chemical plating processes, CVD, ALD, PVD, or the like. In some embodiments, the gap-fill materials 102 may be formed of a molding compound, epoxy, or the like. The gap-fill materials 102 may be applied by compression molding, transfer molding, or the like. The gap-fill materials 102 may fill gaps between adjacent heat transfer dies 90 and die stacks 80. After the liner layers 100 and the gap-fill materials 102 are deposited, a planarization process, such as a CMP, a grinding process, an etch-back process, or the like is performed to remove excess portions of the liner layers 100 and the gap-fill materials 102, exposing the heat transfer dies 90 and the die stacks 80.

The materials of the liner layers 100 and the gap-fill materials 102 may be selected based on the thickness of the heat transfer dies 90 and the die stacks 80. For example, in embodiments in which the heat transfer dies 90 and the die stacks 80 have thicknesses $T_4$ less than about 100 μm, the gap-fill materials 102 may be a gap-fill oxide. In some embodiments in which the heat transfer dies 90 and the die stacks 80 have thicknesses $T_4$ greater than or equal to about 100 μm, the gap-fill materials 102 may be a combination of a spin-on-glass material and a gap-fill oxide. In some embodiments in which the heat transfer dies 90 and the die stacks 80 have thicknesses $T_4$ greater than or equal to about 100 μm, the gap-fill materials 102 may be a conductive material, such as a metal that may include copper or the like. In such embodiments, the liner layers 100 may be a barrier layer. In embodiments in which the heat transfer dies 90 and the die stacks 80 have thicknesses $T_4$ equal to or greater than about 400 μm, the gap-fill materials 102 may be a molding compound material, an epoxy, or the like. Forming the gap-fill materials 102 from conductive materials, such as metals, increases heat dissipation from the integrated circuit dies 50 and the die stacks 80, improving device performance and reducing device defects in completed packaged semiconductor devices. Forming the gap-fill materials 102 from a molding compound material or epoxy may eliminate the need for a subsequently attached support substrate, which reduces costs and reduces thicknesses of completed packaged semiconductor devices.

In FIG. 9, a bonding layer 104 is formed on the die stacks 80, the heat transfer dies 90, the liner layers 100, and the gap-fill materials 102. The bonding layer 104 may be an oxide layer, such as silicon oxide (e.g., an HDP oxide or the like). The bonding layer 104 may be deposited on surfaces of the die stacks 80, the heat transfer dies 90, the liner layers 100, and the gap-fill materials 102 using, for example, CVD, ALD, PVD, thermal oxidation, or the like. Other suitable materials may be used for the bonding layer 104. The bonding layer 104 may have a thickness $T_6$ in a range from about 30 Å to about 200 Å. The bonding layer 104 may be used in subsequent dielectric-to-dielectric bonding processes, such as processes used to bond a support substrate to the die stacks 80, the heat transfer dies 90, the liner layers 100, and the gap-fill materials 102. Providing the bonding layer 104 with the prescribed thickness minimizes the thickness of the bonding layer 104, while providing sufficient material for bonding processes used to attach the support substrate to the die stacks 80, the heat transfer dies 90, the liner layers 100, and the gap-fill materials 102. Minimizing the thickness of the bonding layer 104 reduces the thermal resistance of the bonding layer 104, which improves heat dissipation in packaged semiconductor devices.

In FIG. 10, a support substrate 110 is attached to the heat transfer dies 90 and the die stacks 80 forming a packaged semiconductor device 200. The support substrate 110 may be bonded to the heat transfer dies 90 and the die stacks 80 by bonding a bonding layer 112 on the support substrate 110 to the bonding layer 104 on the die stacks 80, the heat transfer dies 90, the liner layers 100, and the gap-fill materials 102. The support substrate 110 may be a glass support substrate, a ceramic support substrate, a wafer (e.g., a silicon wafer), or the like. The support substrate 110 may provide structural support during subsequent processing steps and in the completed device.

In some embodiments, the support substrate 110 may be bonded to the heat transfer dies 90 and the die stacks 80 using a suitable technique, such as dielectric-to-dielectric bonding or the like. The bonding layer 112 may be an oxide layer, such as silicon oxide (e.g., an HDP oxide or the like), that is formed on a surface of the support substrate 110 prior to bonding using, for example, CVD, ALD, PVD, thermal oxidation, or the like. Other suitable materials may be used for the bonding layer 112. The dielectric-to-dielectric bonding process may be the same as or similar to the dielectric-to-dielectric bonding process described above with respect to FIG. 3 and used to bond the carrier substrate 120 to the integrated circuit dies 50. The bonding layer 112 may have a thickness $T_7$ in a range from about 30 Å to about 200 Å. Providing the bonding layer 112 with the prescribed thickness minimizes the thickness of the bonding layer 112, while providing sufficient material for bonding processes used to attach the support substrate 110 to the die stacks 80, the heat transfer dies 90, the liner layers 100, and the gap-fill materials 102. Minimizing the thickness of the bonding layer 112 reduces the thermal resistance of the bonding layer 112, which improves heat dissipation in packaged semiconductor devices.

In the embodiment of FIGS. 3 through 10, the heat transfer dies 90 are bonded to the integrated circuit dies 50 by dielectric-to-dielectric bonds (e.g., fusion bonding), the die stacks 80 are bonded to the integrated circuit dies 50 by dielectric-to-dielectric bonds and metal-to-metal bonds (e.g., hybrid bonding), and the support substrate 110 is bonded to the heat transfer dies 90 and the die stacks 80 by dielectric-to-dielectric bonds (e.g., fusion bonding). The thicknesses of each of the dielectric layers used in the dielectric-to-dielectric bonding may be minimized, which reduces thermal resistance in the packaged semiconductor device 200 and increases heat dissipation from the integrated circuit dies 50 and the die stacks 80. The die connectors 66 and the dielectric layers 68 of the die stacks 80 may be directly coupled to the conductive vias 70 and the insulating layers 76 of the integrated circuit dies 50 without additional bond pads and/or dielectric layers formed there between, which further reduces overall thicknesses of dielectric layers included in the packaged semiconductor devices, reducing thermal resistance in the packaged semiconductor device 200 and increasing heat dissipation from the integrated circuit dies 50 and the die stacks 80 Eliminating additional layers used to bond the die stacks 80 to the integrated circuit dies 50 also reduces costs and increases throughput. Thus, the packaged semiconductor device 200 may be formed with reduced costs, increased throughput, improved device performance, and reduced device defects.

FIGS. 11 through 14B illustrate an embodiment in which heat transfer dies 90 are bonded to integrated circuit dies 50 by dielectric-to-dielectric bonds and metal-to-metal bonds (e.g., hybrid bonding) and a support substrate 110 is bonded to the heat transfer dies 90 and die stacks 80 by dielectric-to-dielectric bonds and metal-to-metal bonds (e.g., hybrid bonding). The structure illustrated in FIG. 11 may be formed by processes the same as or similar to those discussed above with respect to FIGS. 3 through 6.

Figure 11:
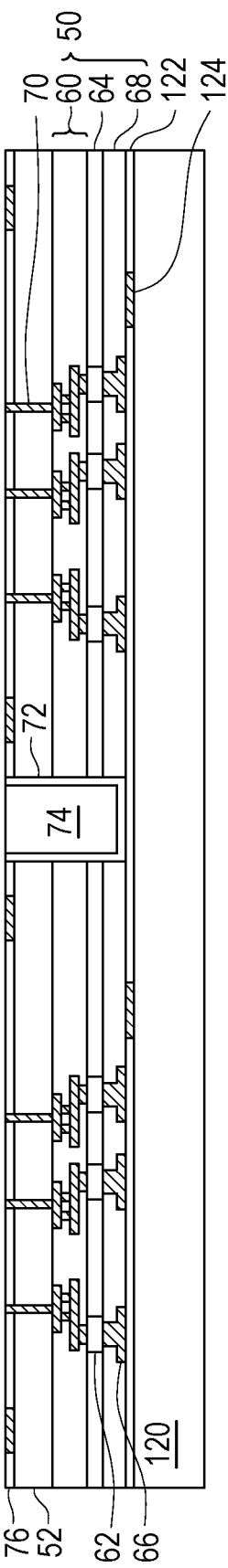

In FIG. 11, bond pads 78 are formed in the insulating layers 76. In some embodiments, the bond pads 78 may be dummy bond pads, which are not coupled to any metal features of the integrated circuit dies 50. To form the bond pads 78, openings may be formed in the insulating layers 76.

The openings may be formed using acceptable photolithography and etching techniques. The openings may be formed extending through the insulating layer 76. In some embodiments, the openings may extend at least partially into the semiconductor substrates 52. A liner layer, a barrier layer, an adhesion layer, and/or a conductive fill material may be formed in the openings and may be used to form the bond pads 78. The liner layer, the barrier layer, and the adhesion layer may be formed by ALD, PVD, CVD, thermal oxidation, or the like. The conductive fill material may be formed by plating, such as electroplating or electroless plating, or the like. In some embodiments, the liner layer may include oxides, such as silicon oxide, silicon oxynitride, or the like. The barrier layer and the adhesion layer may include titanium, titanium nitride, tantalum, tantalum nitride, or the like. The conductive fill materials may include copper, a copper alloy, silver, gold, tungsten, ruthenium, cobalt, aluminum, nickel, or the like. A planarization process such as a CMP may be performed to remove excess portions of the liner layer, a barrier layer, an adhesion layer, and/or a conductive fill material, until the insulating layers 76 are exposed. The remaining portions of the liner layer, a barrier layer, an adhesion layer, and/or a conductive fill material form the bond pads 78, which are subsequently used for bonding.

The bond pads 78 may be formed outside an area occupied by the conductive vias 70. Forming bond pads over the conductive vias 70 may require thicker insulating layers 76 to be formed around the conductive vias to isolate the bond pads 78 from one another. This increases thermal resistance and reduces heat dissipation in completed packaged semiconductor devices. As such, forming the bond pads 78 outside the area occupied by the conductive vias 70 and omitting bond pads formed on the conductive vias 70 allows for thinner insulating layers 76 to be provided, reduces thermal resistance, and improves heat dissipation in packaged semiconductor devices. This improves device performance and reduces device defects caused by overheating.

Figure 12A:
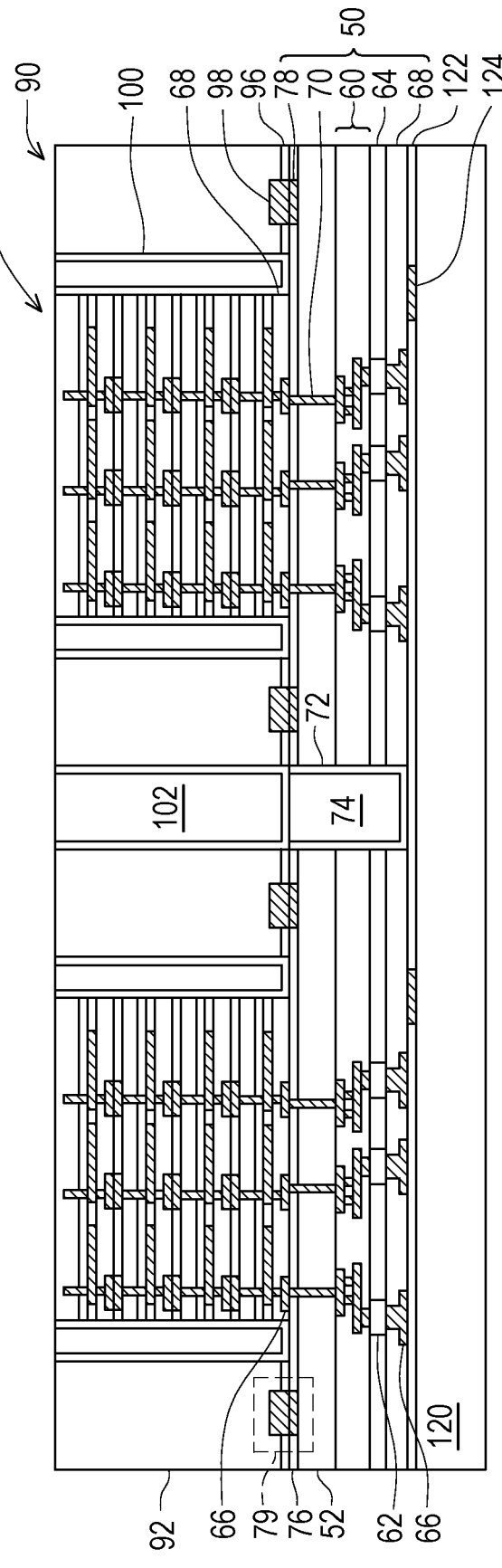
Figure 12B:
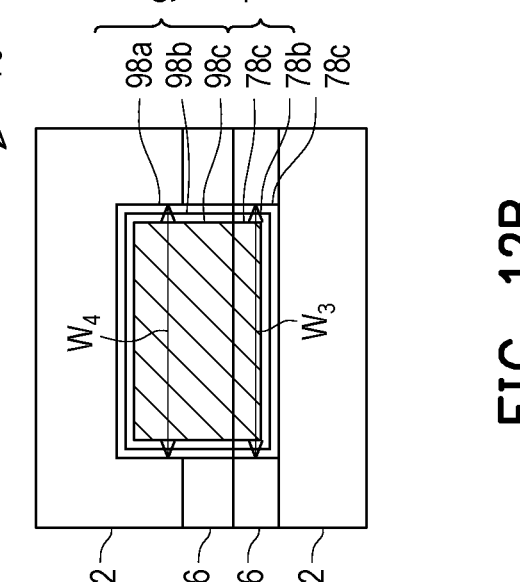

In FIGS. 12A and 12B, die stacks 80 and heat transfer dies 90 are bonded to the insulating layers 76 on the integrated circuit dies 50 and liner layers 100 and a gap-fill materials 102 are formed on the heat transfer dies 90, the die stacks 80, and the integrated circuit dies 50. FIG. 12B illustrates a detailed view of a region 79 of FIG. 12A. The die stacks 80 may be bonded to the insulating layers 76 and the conductive vias 70 of the integrated circuit dies 50 by processes the same as or similar to those discussed above with respect to FIGS. 7A and 7B. Specifically, dielectric layers 68 of the die stacks 80 may be bonded to the insulating layers 76 of the integrated circuit dies 50 by dielectric-to-dielectric bonds and die connectors 66 of the die stacks 80 may be bonded to the conductive vias 70 of the integrated circuit dies 50 by metal-to-metal bonds in a hybrid bonding configuration.

In the embodiment illustrated in FIGS. 12A and 12B, the heat transfer dies 90 are bonded to the integrated circuit dies 50 by hybrid bonding. The heat transfer dies 90 include substrates 92, dielectric layers 96 on the substrates 92, and bond pads 98 in the dielectric layers 96 and/or the substrates 92. The substrates 92 may be the same as or similar to the substrates 92 discussed above with respect to FIGS. 7A and 7B. The dielectric layers 96 may be formed of materials and by processes the same as or similar to those discussed above for the dielectric layers 94 with respect to FIG. 8. In some embodiments, the bond pads 98 may be formed from materials and by processes the same as or similar to the conductive vias 70, discussed above with respect to FIG. 1. In some embodiments, the bond pads 98 may be formed by forming recesses in the dielectric layers 96 and/or the substrates 92. The recesses may be formed by etching, milling, laser techniques, a combination thereof, or the like. A barrier layer and/or an adhesion layer may be conformally deposited in the recesses, a conductive fill material may be deposited on the barrier layer and/or the adhesion layer, and a planarization process may be performed on the barrier layer, the adhesion layer, and/or the conductive fill material. Remaining portions of the barrier layer, the adhesion layer, and/or the conductive fill material form the bond pads 98.

The heat transfer dies 90 are bonded to the integrated circuit dies 50 through the dielectric layers 96, the bond pads 98, the insulating layers 76, and the bond pads 78. Specifically, the dielectric layers 96 of the heat transfer dies 90 may be directly bonded to the insulating layers 76 of the integrated circuit dies 50 and the bond pads 98 of the heat transfer dies may be directly bonded to the bond pads 78 of the integrated circuit dies 50. In some embodiments, the bonds between the insulating layers 76 and the dielectric layers 96 are dielectric-to-dielectric bonds, such as oxide-to-oxide bonds or the like. The hybrid bonding process directly bonds the bond pads 98 of the heat transfer dies 90 to the bond pads 78 of the integrated circuit dies 50 through direct metal-to-metal bonding. In some embodiments, interfaces between the heat transfer dies 90 and the integrated circuit dies 50 also include dielectric-to-metal interfaces (e.g., where the bond pads 98 and the bond pads 78 are not perfectly aligned and/or have different widths). The hybrid bonding process used to bond the heat transfer dies 90 to the integrated circuit dies 50 may be performed by a process the same as or similar to the process discussed above with respect to FIGS. 7A and 7B and used for hybrid bonding the die stacks 80 to the integrated circuit dies 50. Providing the bond pads 78 in the integrated circuit dies 50 and the bond pads 98 in the heat transfer dies 90 may further improve thermal conductance between the integrated circuit dies 50 and the heat transfer dies 90. This improves heat dissipation from the integrated circuit dies 50, which improves device performance and reduces device defects caused by overheating in packaged semiconductor devices.

FIG. 12B illustrates additional details of the bond pads 78 and the bond pads 98. As illustrated in FIG. 12B, the bond pads 78 may include barrier layers 78a, adhesion layers 78b, and/or conductive fill materials 78c. The bond pads 98 may include barrier layers 98a, adhesion layers 98b, and/or conductive fill materials 98c. In some embodiments, the barrier layers 78a and 98a may include titanium, titanium nitride, tantalum, tantalum nitride, or the like. The adhesion layers 78b and 98b may include titanium, titanium nitride, tantalum, tantalum nitride, or the like. The conductive fill materials 78c and 98c may include copper, a copper alloy, silver, gold, tungsten, ruthenium, cobalt, aluminum, nickel, or the like. The bond pads 78 may have widths $W_3$ in a range from about 2 μm to about 5 μm, the bond pads 98 may have widths $W_4$ in a range from about 2 μm to about 5 μm, and a ratio of the widths $W_4$ of the bond pads 98 to the widths $W_3$ of the bond pads 78 may be in a range from about 1 to about 2.5. Providing the bond pads 78 and the bond pads 98 with the prescribed widths ensures good bonding between the heat transfer dies 90 and the integrated circuit dies 50.

The liner layers 100 and the gap-fill materials 102 may be formed after bonding the heat transfer dies 90 and the die stacks 80 to the integrated circuit dies 50. The liner layers 100 and the gap-fill materials 102 may be formed of materials and by processes the same as or similar to those discussed above with respect to FIG. 8.

Figure 13:
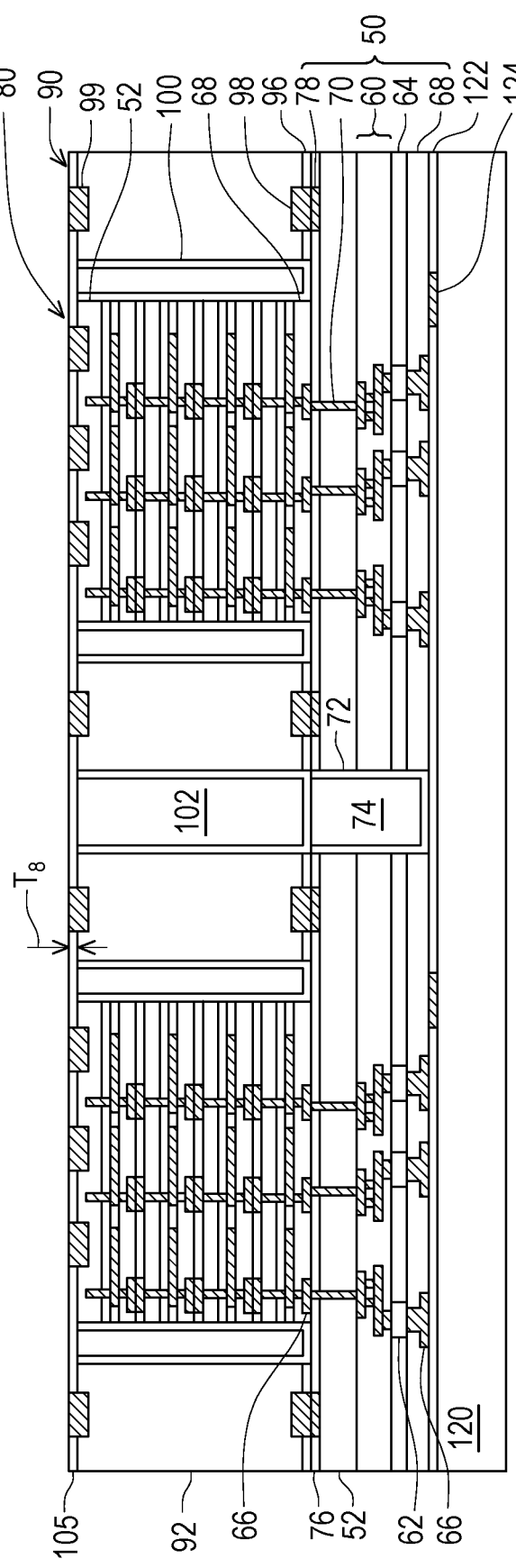

In FIG. 13, a bonding layer 105 is formed on the die stacks 80, the heat transfer dies 90, the liner layers 100, and the gap-fill materials 102, and bond pads 99 are formed in the bonding layer 105, the substrates 92 of the heat transfer dies 90, and/or the semiconductor substrates 52 of the die stacks 80. The bonding layer 105 may be an oxide layer, such as silicon oxide (e.g., an HDP oxide or the like), silicon oxynitride, or the like. The bonding layer 105 may be deposited on surfaces of the die stacks 80, the heat transfer dies 90, the liner layers 100, and the gap-fill materials 102 using, for example, CVD, ALD, PVD, thermal oxidation, or the like. Other suitable materials may be used for the bonding layer 105. The bonding layer 105 may have a thickness $T_8$ in a range from about 30 Å to about 2000 Å. The bonding layer 105 may be used in subsequent dielectric-to-dielectric bonding processes, such as processes used to bond a support substrate to the die stacks 80 and the heat transfer dies 90. Providing the bonding layer 105 with the prescribed thickness minimizes the thickness of the bonding layer 105, while providing sufficient material for bonding processes used to attach the support substrate to the die stacks 80 and the heat transfer dies 90. Minimizing the thickness of the bonding layer 105 reduces the thermal resistance of the bonding layer 105, which improves heat dissipation in packaged semiconductor devices.

In some embodiments, the bond pads 99 may be formed from materials and by processes the same as or similar to the bond pads 98, discussed above with respect to FIGS. 12A and 12B. In some embodiments, the bond pads 99 may be formed by forming recesses in the bonding layer 105, the substrates 92 of the heat transfer dies 90, and/or the semiconductor substrates 52 of the die stacks 80. The recesses may be formed by etching, milling, laser techniques, a combination thereof, or the like. A barrier layer and/or an adhesion layer may be conformally deposited in the recesses, a conductive fill material may be deposited on the barrier layer and/or the adhesion layer, and a planarization process may be performed on the barrier layer, the adhesion layer, and/or the conductive fill material. Remaining portions of the barrier layer, the adhesion layer, and/or the conductive fill material form the bond pads 99. In some embodiments, the bond pads 99 may be dummy bond pads, which are not coupled to any metal features of the die stacks 80.

Figure 14A:
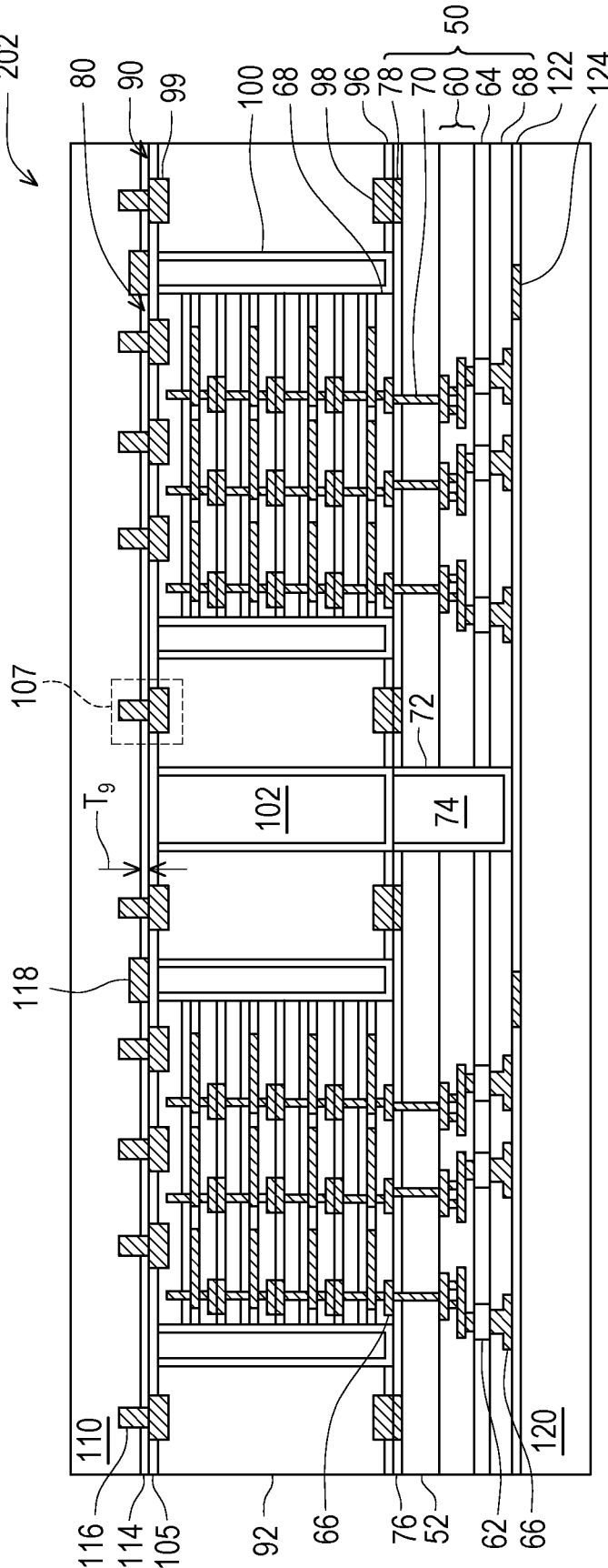
Figure 14B:
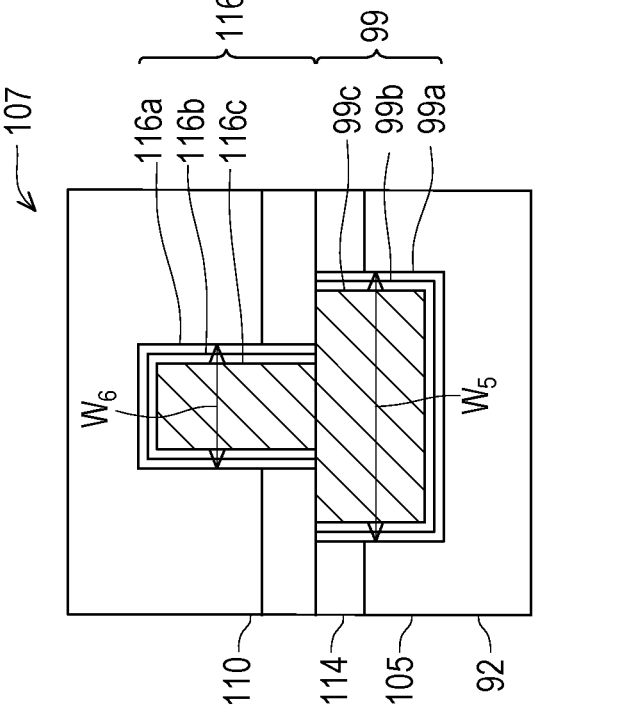

In FIGS. 14A and 14B, a support substrate 110 is attached to the heat transfer dies 90 and the die stacks 80 forming a packaged semiconductor device 202. The support substrate 110 may be bonded to the heat transfer dies 90 and the die stacks 80 by bonding a bonding layer 114 and bond pads 116 on the support substrate 110 to the bonding layer 105 and the bond pads 99 on the die stacks 80, the heat transfer dies 90, the liner layers 100, and the gap-fill materials 102. The support substrate 110 may be a glass support substrate, a ceramic support substrate, a wafer (e.g., a silicon wafer), or the like. The support substrate 110 may provide structural support during subsequent processing steps and in the completed device.

In some embodiments, the support substrate 110 may be bonded to the heat transfer dies 90 and the die stacks 80 using a suitable technique, such as a combination of dielectric-to-dielectric bonding and metal-to-metal bonding or the like. The bonding layer 114 may be an oxide layer, such as silicon oxide (e.g., an HDP oxide or the like), silicon oxynitride, or the like. The bonding layer 114 may be formed on a surface of the support substrate 110 prior to bonding using, for example, CVD, ALD, PVD, thermal oxidation, or the like. Other suitable materials may be used for the bonding layer 114.

In some embodiments, the bond pads 116 may be formed from materials and by processes the same as or similar to the bond pads 98, discussed above with respect to FIGS. 12A and 12B. In some embodiments, the bond pads 116 may be formed by forming recesses in the bonding layer 114 and/or the support substrate 110. The recesses may be formed by etching, milling, laser techniques, a combination thereof, or the like. A barrier layer and/or an adhesion layer may be conformally deposited in the recesses, a conductive fill material may be deposited on the barrier layer and/or the adhesion layer, and a planarization process may be performed on the barrier layer, the adhesion layer, and/or the conductive fill material. Remaining portions of the barrier layer, the adhesion layer, and/or the conductive fill material form the bond pads 116. In some embodiments, alignment marks 118 may also be formed in the bonding layer 114. The alignment marks 118 may be formed of materials and by processes the same as or similar to those used for the alignment marks 124, discussed above with respect to FIG. 3.

The dielectric-to-dielectric and metal-to-metal bonding processes used to bond the support substrate to the heat transfer dies 90 and the die stacks 80 may be the same as or similar to the dielectric-to-dielectric and metal-to-metal bonding processes described above with respect to FIGS. 7A and 7B and used to bond the die stacks 80 to the integrated circuit dies 50. The bonding layer 114 may have a thickness $T_9$ in a range from about 30 Å to about 2000 Å. Providing the bonding layer 114 with the prescribed thickness minimizes the thickness of the bonding layer 114, while providing sufficient material for bonding processes used to attach the support substrate 110 to the die stacks 80, the heat transfer dies 90, the liner layers 100, and the gap-fill materials 102. Minimizing the thickness of the bonding layer 114 reduces the thermal resistance of the bonding layer 114, which improves heat dissipation in packaged semiconductor devices. Providing the bond pads 99 in the heat transfer dies 90 and the die stacks 80 and providing the bond pads 116 in the support substrate 110 may further improve thermal conductance from the heat transfer dies 90 and the die stacks 80 to the support substrate 110. This improves heat dissipation from the heat transfer dies 90 and the die stacks 80, which improves device performance and reduces device defects caused by overheating in the packaged semiconductor device 202.

FIG. 14B illustrates additional details of the bond pads 99 and the bond pads 116. FIG. 14B illustrates a detailed view of a region 107 of FIG. 14A. As illustrated in FIG. 14B, the bond pads 99 may include barrier layers 99a, adhesion layers 99b, and/or conductive fill materials 99c. The bond pads 116 may include barrier layers 116a, adhesion layers 116b, and/or conductive fill materials 116c. In some embodiments, the barrier layers 99a and 116a may include titanium, titanium nitride, tantalum, tantalum nitride, or the like. The adhesion layers 99b and 116b may include titanium, titanium nitride, tantalum, tantalum nitride, or the like. The conductive fill materials 99c and 116c may include copper, a copper alloy, silver, gold, tungsten, ruthenium, cobalt, aluminum, nickel, or the like. The bond pads 99 may have widths W5 in a range from about 2.5 μm to about 5 μm, the bond pads 116 may have widths W6 in a range from about 2 μm to about 4.5 μm, and a ratio of the widths W6 of the bond pads 116 to the widths W5 of the bond pads 99 may be in a range from about 0.4 to about 1.8. Providing the bond pads 99 and the bond pads 116 with the prescribed widths ensures good bonding between the support substrate 110 and the heat transfer dies 90 and the die stacks 80.

In the embodiment of FIGS. 11 through 14B, the heat transfer dies 90 are bonded to the integrated circuit dies 50 by dielectric-to-dielectric bonds and metal-to-metal bonds (e.g., hybrid bonding), the die stacks 80 are bonded to the integrated circuit dies 50 by dielectric-to-dielectric bonds and metal-to-metal bonds (e.g., hybrid bonding), and the support substrate 110 is bonded to the heat transfer dies 90 and the die stacks 80 by dielectric-to-dielectric bonds and metal-to-metal bonds (e.g., hybrid bonding). The thicknesses of each of the dielectric layers used in the dielectric-to-dielectric bonding may be minimized, which reduces thermal resistance in the packaged semiconductor device 202 and increases heat dissipation from the integrated circuit dies 50 and the die stacks 80. The die connectors 66 and the dielectric layers 68 of the die stacks 80 may be directly coupled to the conductive vias 70 and the insulating layers 76 of the integrated circuit dies 50 without additional bond pads and/or dielectric layers formed there between, which further reduces overall thicknesses of dielectric layers included in the packaged semiconductor devices, reducing thermal resistance in the packaged semiconductor device 202 and increasing heat dissipation from the integrated circuit dies 50 and the die stacks 80 Eliminating additional layers used to bond the die stacks 80 to the integrated circuit dies 50 also reduces costs and increases throughput. Including additional bond pads to bond the heat transfer dies 90 to the integrated circuit dies 50 and to bond the support substrate 110 to the heat transfer dies 90 and the die stacks 80 may further reduce thermal resistance and increase heat dissipation from the heat transfer dies 90, the die stacks 80, and the integrated circuit dies 50. Thus, the packaged semiconductor device 202 may be formed with reduced costs, increased throughput, improved device performance, and reduced device defects.

Figure 15:
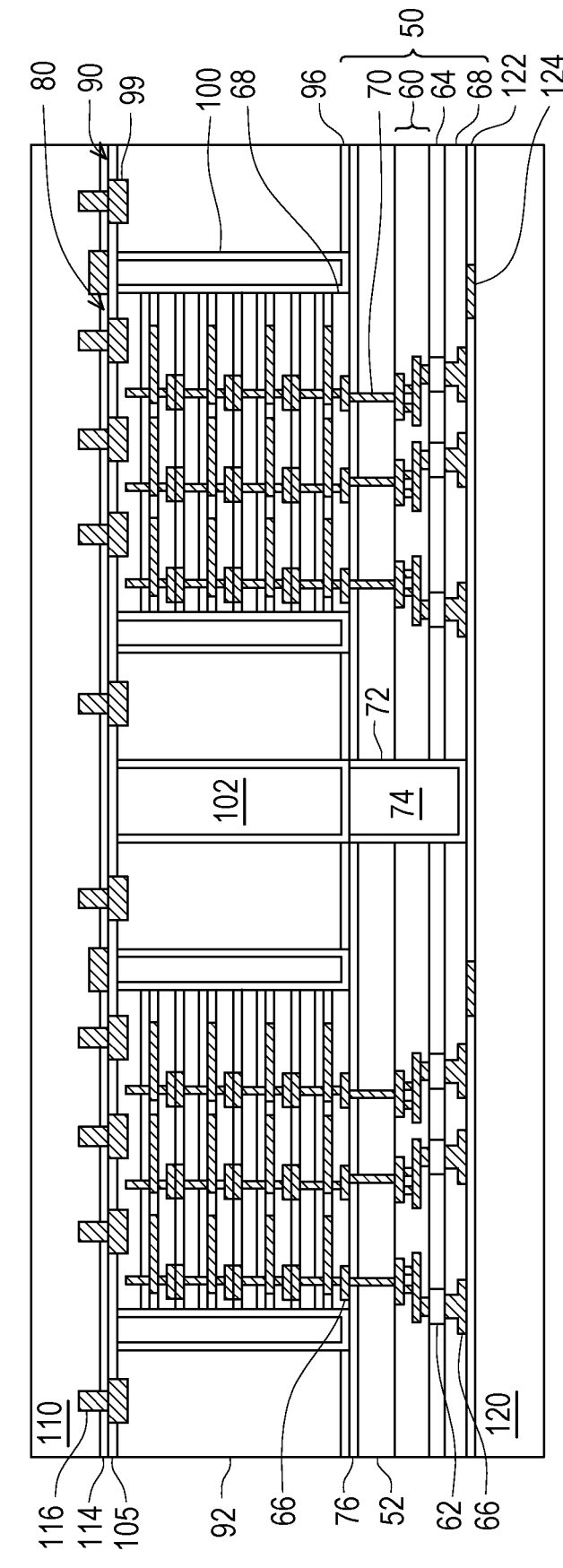

FIG. 15 illustrates an embodiment in which heat transfer dies 90 are bonded to integrated circuit dies 50 by dielectric-to-dielectric bonds (e.g., fusion bonding), die stacks 80 are bonded to the integrated circuit dies 50 by dielectric-to-dielectric bonds and metal-to-metal bonds (e.g., hybrid bonding), and a support substrate 110 is bonded to the heat transfer dies 90 and the die stacks 80 by dielectric-to-dielectric bonds and metal-to-metal bonds (e.g., hybrid bonding), thus forming a packaged semiconductor device 204. The heat transfer dies 90 and the die stacks 80 may be bonded to the integrated circuit dies 50 by processes the same as or similar to those discussed above with respect to FIGS. 7A and 7B. The support substrate 110 may be bonded to the heat transfer dies 90 and the die stacks 80 by processes the same as or similar to those discussed above with respect to FIGS. 14A and 14B.

In the embodiment of FIG. 15, the thicknesses of each of the dielectric layers used in the dielectric-to-dielectric bonding may be minimized, which reduces thermal resistance in the packaged semiconductor device 204 and increases heat dissipation from the integrated circuit dies 50 and the die stacks 80. The die connectors 66 and the dielectric layers 68 of the die stacks 80 may be directly coupled to the conductive vias 70 and the insulating layers 76 of the integrated circuit dies 50 without additional bond pads and/or dielectric layers formed there between, which further reduces overall thicknesses of dielectric layers included in the packaged semiconductor devices, reducing thermal resistance in the packaged semiconductor device 204 and increasing heat dissipation from the integrated circuit dies 50 and the die stacks 80 Eliminating additional layers used to bond the die stacks 80 to the integrated circuit dies 50 reduces costs and increases throughput. Including additional bond pads to bond the support substrate 110 to the heat transfer dies 90 and the die stacks 80 may further reduce thermal resistance and increase heat dissipation from the heat transfer dies 90, the die stacks 80, and the integrated circuit dies 50. Thus, the packaged semiconductor device 204 may be formed with reduced costs, increased throughput, improved device performance, and reduced device defects.

Figure 16:
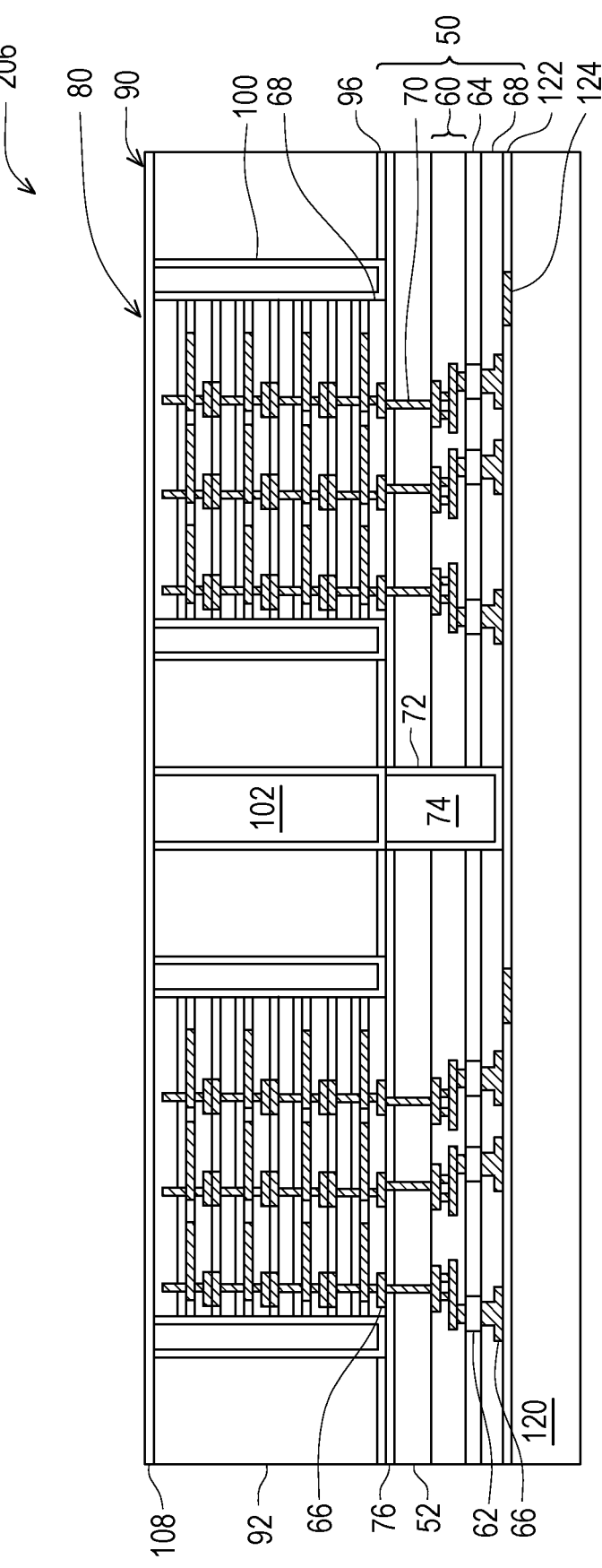

FIG. 16 illustrates an embodiment in which heat transfer dies 90 are bonded to integrated circuit dies 50 by dielectric-to-dielectric bonds (e.g., fusion bonding), die stacks 80 are bonded to the integrated circuit dies 50 by dielectric-to-dielectric bonds and metal-to-metal bonds (e.g., hybrid bonding), and the support substrate 110 of the previous embodiments is omitted, thus forming a packaged semiconductor device 206. The structure illustrated in FIG. 16 may be formed by processes the same as or similar to those discussed above with respect to FIGS. 3 through 8. In the embodiment of FIG. 16, the heat transfer dies 90 and the die stacks 80 have thicknesses $T_4$ equal to or greater than about 400 $\mu$m, which allows for the support substrate 110 to be omitted. This reduces costs and manufacturing processes associated with the support substrate 110, and may reduce the overall thickness of the packaged semiconductor device 206.

In FIG. 16, an insulating layer 108 is formed on the heat transfer dies 90, the die stacks 80, the liner layers 100, and the gap-fill materials 102. The insulating layer 108 may be formed of silicon oxide, silicon carbide, silicon oxynitride, silicon oxy-carbo-nitride, PSG, BSG, BPSG, or the like. The insulating layer 108 may be deposited by CVD, ALD, spin-on coating, or the like.

In the embodiment of FIG. 16, the thicknesses of each of the dielectric layers used in the dielectric-to-dielectric bonding may be minimized, which reduces thermal resistance in the packaged semiconductor device 206 and increases heat dissipation from the integrated circuit dies 50 and the die stacks 80. The die connectors 66 and the dielectric layers 68 of the die stacks 80 may be directly coupled to the conductive vias 70 and the insulating layers 76 of the integrated circuit dies 50 without additional bond pads and/or dielectric layers formed there between, which further reduces overall thicknesses of dielectric layers included in the packaged semiconductor devices, reducing thermal resistance in the packaged semiconductor device 206 and increasing heat dissipation from the integrated circuit dies 50 and the die stacks 80 Eliminating additional layers used to bond the die stacks 80 to the integrated circuit dies 50 reduces costs and increases throughput. Omitting the support substrate 110 may reduce processing steps for forming the packaged semiconductor device 206 and may reduce the thickness of the packaged semiconductor device 206. Thus, the packaged semiconductor device 206 may be formed with reduced costs, increased throughput, reduced thickness, improved device performance, and reduced device defects.

Embodiments may achieve various advantages. For example, bonding the heat transfer dies, the die stacks, the support substrates, and the integrated circuit dies of the packaged semiconductor devices according to the above-described methods allows thicknesses of dielectric layers in the packaged semiconductor devices to be minimized. This reduces thermal resistance, improves heat dissipation from the integrated circuit dies and the die stacks, improves device performance, and reduces device defects caused by over-heating.

In accordance with an embodiment, a semiconductor package includes a first die including a semiconductor substrate and a through via extending through the semiconductor substrate; a second die bonded to the first die, the second die including a bond pad, the bond pad being physically and electrically coupled to the through via by metal-to-metal bonds; and an encapsulating material on the first die and laterally encapsulating the second die. In an embodiment, the semiconductor package further includes a heat transfer die bonded to the first die adjacent the second die, the heat transfer die being bonded to the first die by dielectric-to-dielectric bonds. In an embodiment, the heat transfer die includes a silicon substrate free from integrated circuit devices. In an embodiment, the semiconductor package further includes a gap fill material between the heat transfer die and the second die, surfaces of the gap fill material, the heat transfer die, and the second die opposite the first die being level with one another. In an embodiment, the gap fill material includes copper. In an embodiment, the first die includes a system on chip, and the second die includes a stack of static random access memory chips. In an embodiment, the semiconductor package further includes a support substrate bonded to the second die opposite the first die, the support substrate being bonded to the second die by dielectric-to-dielectric bonds. In an embodiment, the support substrate is bonded to the second die by dielectric-to-dielectric bonds between a first bond layer on the second die and a second bond layer on the support substrate, and the first bond layer and the second bond layer have thicknesses less than 200 Å.

In accordance with an embodiment, a method includes providing a first semiconductor die; etching a backside of the first semiconductor die to expose a through via; forming a first dielectric layer laterally adjacent the through via; and bonding a second semiconductor die to the first semiconductor die, a first bond pad of the second semiconductor die being bonded to the through via by metal-to-metal bonding, and a second dielectric layer of the second semiconductor die being bonded to the first dielectric layer by dielectric-to-dielectric bonding. In an embodiment, the method further includes bonding a heat dissipation die to the first semiconductor die, a third dielectric layer of the heat dissipation die being bonded to the first dielectric layer by dielectric-to-dielectric bonding. In an embodiment, the method further includes forming a fourth dielectric layer on surfaces of the second semiconductor die and the heat dissipation die opposite the first semiconductor die; and bonding a fifth dielectric layer of a support die to the fourth dielectric layer, the fourth dielectric layer and the fifth dielectric layer having thicknesses of less than 200 Å. In an embodiment, the method further includes bonding a heat dissipation die to the first semiconductor die, a third dielectric layer of the heat dissipation die being bonded to the first dielectric layer by dielectric-to-dielectric bonding, a second bond pad of the heat dissipation die being bonded to a third bond pad of the first semiconductor die by metal-to-metal bonding. In an embodiment, the method further includes planarizing the through via and the first dielectric layer, the first dielectric layer having a thickness of less than 500 Å. In an embodiment, the first dielectric layer includes silicon oxynitride, and the second dielectric layer includes silicon oxide.

In accordance with yet another embodiment, a method includes fusion bonding a thermal enhancement die to a logic die; hybrid bonding a memory die to the logic die; forming gap fill material between the thermal enhancement die and the memory die; planarizing the gap fill material, the thermal enhancement die, and the memory die; forming a first dielectric layer on the gap fill material, the thermal enhancement die, and the memory die; and fusion bonding a support substrate to the first dielectric layer, the support substrate including a second dielectric layer bonded to the first dielectric layer by the fusion bonding. In an embodiment, the first dielectric layer and the second dielectric layer have thicknesses less than 200 Å. In an embodiment, hybrid bonding the memory die to the logic die includes forming dielectric-to-dielectric bonds between a third dielectric layer of the logic die and a fourth dielectric layer of the memory die and forming metal-to-metal bonds between a through via of the logic die and a first bond pad of the memory die, the through via extending through the third dielectric layer and a semiconductor substrate of the logic die. In an embodiment, the third dielectric layer includes silicon oxynitride, and the fourth dielectric layer includes silicon oxide. In an embodiment, the gap fill material includes copper. In an embodiment, the gap fill material includes an oxide dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first die comprising a semiconductor substrate, a first dielectric layer, and a through via extending through the semiconductor substrate and the first dielectric layer;
a second die bonded to the first die, the second die comprising a second dielectric layer and a bond pad in the second dielectric layer, wherein the bond pad is physically and electrically coupled to the through via, the bond pad of the second die being directly bonded to the through via by metal-to-metal bonds, the first dielectric layer being bonded to the second dielectric layer by dielectric-to-dielectric bonding;
a heat transfer die bonded to the first die adjacent the second die, wherein the heat transfer die is bonded to the first die by dielectric-to-dielectric bonds;
an encapsulating material on the first die and laterally encapsulating the second die; and
a gap fill material between the heat transfer die and the second die, wherein surfaces of the gap fill material, the heat transfer die, and the second die opposite the first die are level with one another, wherein the gap fill material comprises copper.

2. The semiconductor package of claim 1, wherein the heat transfer die comprises a silicon substrate free from integrated circuit devices.

3. The semiconductor package of claim 1, wherein the first die comprises a system on chip, and wherein the second die comprises a stack of static random access memory chips.

4. The semiconductor package of claim 1, further comprising a support substrate bonded to the second die opposite the first die, wherein the support substrate is bonded to the second die by dielectric-to-dielectric bonds.

5. The semiconductor package of claim 4, wherein the support substrate is bonded to the second die by dielectric-to-dielectric bonds between a first bond layer on the second die and a second bond layer on the support substrate, and wherein the first bond layer and the second bond layer have thicknesses less than 200 Å.

6. A method comprising:

providing a first semiconductor die;

etching a backside of the first semiconductor die to expose a through via;

forming a first dielectric layer laterally adjacent the through via;

bonding a second semiconductor die to the first semiconductor die, wherein a first bond pad of the second semiconductor die is bonded to the through via by metal-to-metal bonding, and wherein a second dielectric layer of the second semiconductor die is bonded to the first dielectric layer by dielectric-to-dielectric bonding; and bonding a heat dissipation die to the first semiconductor die, wherein a third dielectric layer of the heat dissipation die is bonded to the first dielectric layer by dielectric-to-dielectric bonding, wherein a second bond pad of the heat dissipation die is bonded to a third bond pad of the first semiconductor die by metal-to-metal bonding.

7. The method of claim 6, further comprising:

forming a fourth dielectric layer on surfaces of the second semiconductor die and the heat dissipation die opposite the first semiconductor die; and bonding a fifth dielectric layer of a support die to the fourth dielectric layer, wherein the fourth dielectric layer and the fifth dielectric layer have thicknesses of less than 200 Å.

8. The method of claim 6, further comprising planarizing the through via and the first dielectric layer, wherein the first dielectric layer has a thickness of less than 500 Å.

9. The method of claim 6, wherein the first dielectric layer comprises silicon oxynitride, and wherein the second dielectric layer comprises silicon oxide.

10. A method comprising:

fusion bonding a thermal enhancement die to a logic die;

hybrid bonding a memory die to the logic die;

forming a gap fill material between the thermal enhancement die and the memory die;

planarizing the gap fill material, the thermal enhancement die, and the memory die;

forming a first dielectric layer on the gap fill material, the thermal enhancement die, and the memory die; and fusion bonding a support substrate to the first dielectric layer, the support substrate comprising a second dielectric layer bonded to the first dielectric layer by the fusion bonding.

11. The method of claim 10, wherein the first dielectric layer and the second dielectric layer have thicknesses less than 200 Å.

12. The method of claim 10, wherein hybrid bonding the memory die to the logic die comprises forming dielectric-to-dielectric bonds between a third dielectric layer of the logic die and a fourth dielectric layer of the memory die and forming metal-to-metal bonds between a through via of the logic die and a first bond pad of the memory die, wherein the through via extends through the third dielectric layer and a semiconductor substrate of the logic die.

13. The method of claim 12, wherein the third dielectric layer comprises silicon oxynitride, and wherein the fourth dielectric layer comprises silicon oxide.

14. The method of claim 10, wherein the gap fill material comprises copper.

15. The method of claim 10, wherein the gap fill material comprises an oxide dielectric material.

16. The semiconductor package of claim 1, wherein the bond pad has a first width, the through via has a second width, and a ratio of the second width to the first width is in a range from about 0.6 to about 0.8.

17. The semiconductor package of claim 1, further comprising:

one or more additional heat transfer dies bonded to the first die, the one or more additional heat transfer dies being adjacent the second die.

18. The method of claim 6, wherein a width of the through via is less than a width of the first bond pad of the second semiconductor die.

19. The method of claim 6, wherein the heat dissipation die comprises a silicon substrate free from integrated circuit devices.

\* \* \* \* \*